(12) United States Patent
Abe et al.

(10) Patent No.: US 8,546,244 B2
(45) Date of Patent: Oct. 1, 2013

(54) METHOD OF MANUFACTURING SEMICONDUCTOR DEVICE

(75) Inventors: Yoshiyuki Abe, Kanagawa (JP); Chuichi Miyazaki, Kanagawa (JP); Toshihide Uematsu, Kanagawa (JP); Haruo Shimamoto, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/346,716

(22) Filed: Jan. 9, 2012

(65) Prior Publication Data
US 2012/0184068 A1    Jul. 19, 2012

(30) Foreign Application Priority Data
Jan. 14, 2011   (JP) .................... 2011-5546

(51) Int. Cl.
*H01L 21/30*   (2006.01)
*H01L 21/46*   (2006.01)

(52) U.S. Cl.
USPC ............ 438/458; 257/E21.122; 257/E21.214; 257/E21.218; 257/E21.219; 257/E21.237; 257/E21.567; 438/455; 438/459; 438/460; 438/707; 438/745; 438/959; 438/977

(58) Field of Classification Search
USPC .................. 257/E21.122, E21.214, E21.218, 257/E21.219, E21.237, E21.567; 438/455, 438/458, 459, 460, 707, 745, 959, 977
See application file for complete search history.

(56) References Cited

U.S. PATENT DOCUMENTS

| | | | | |
|---|---|---|---|---|
| 5,919,713 A * | 7/1999 | Ishii et al. | ...................... | 438/464 |
| 5,927,993 A * | 7/1999 | Lesk et al. | ...................... | 438/455 |
| 6,429,096 B1 * | 8/2002 | Yanagida | ...................... | 438/459 |
| 7,144,792 B2 * | 12/2006 | Wilmot et al. | ................ | 438/460 |
| 2001/0001215 A1 * | 5/2001 | Siniaguine et al. | ........... | 257/618 |
| 2005/0208296 A1 * | 9/2005 | Saiki et al. | .................... | 428/343 |

FOREIGN PATENT DOCUMENTS
JP     2008-034875 A    2/2008

* cited by examiner

*Primary Examiner* — Asok K Sarkar
(74) *Attorney, Agent, or Firm* — Miles & Stockbridge P.C.

(57) ABSTRACT

A method includes the steps of: (a) fixing a front surface of a wafer (semiconductor wafer) having the front surface, a plurality of chip regions formed on the front surface, a dicing region formed between the chip regions, and a rear surface opposite to the front surface to the supporting member; (b) in a state of having the wafer fixed to the supporting member, grinding the rear surface of the wafer to expose the rear surface; (c) in a state of having the wafer fixed to the supporting member, dividing the wafer into the chip regions; (d) etching side surfaces of the chip regions to remove crushed layers formed in the step (c) on the side surfaces and obtain a plurality of semiconductor chips. After the steps (e) and (d), the plurality of divided chip regions are peeled off from the supporting member to obtain a plurality of semiconductor chips.

18 Claims, 33 Drawing Sheets

METHOD OF MANUFACTURING SEMICONDUCTOR DEVICE

CROSS-REFERENCE TO RELATED APPLICATION

The present application claims priority from Japanese Patent Application No. 2011-5546 filed on Jan. 14, 2011, the content of which is hereby incorporated by reference into this application.

BACKGROUND

The present invention relates to manufacturing technology of a semiconductor device and particularly relates to technology effectively applied to a method of manufacturing a semiconductor device having a step of dividing a semiconductor wafer so as to obtain a plurality of semiconductor chips.

Japanese Patent Application Laid-Open Publication No. 2008-34875 (Patent Document 1) describes forming a curved surface on the edge of the rear surface side of a semiconductor chip. According to above-mentioned Patent Document 1, when the curved surface is formed on the edge on the rear surface side, concentration of stress onto the edge can be suppressed, and bending strength of the semiconductor chip can be enhanced.

For reducing the thickness of and advancing the functions of a semiconductor device, there are demands for the reduction in the thickness of semiconductor chips mounted on the semiconductor device. In recent years, for example, the technique of manufacturing a semiconductor chip having a thickness of 50 µm or less is required.

However, according to the studies of the inventor of the present application, it has been found out that, when the thickness of the semiconductor chip is reduced, a problem that the strength of the semiconductor chip (bending strength or shock resistance strength) is reduced occurs. A crushed layer (miniaturized crack layer of aim-order or less) formed on a rear surface or a side surface of the semiconductor chip due to external force upon processing of a semiconductor wafer in a step of manufacturing the semiconductor device serves as one of main causes that causes reduction in the strength of the semiconductor chip. This crushed layer is formed, for example, on the rear surface (ground surface) of the semiconductor wafer in a step of grinding the rear surface of the semiconductor wafer. The crushed layer is also formed on the side surface (cut surface) of the semiconductor chip in a step of dividing the semiconductor wafer. It has been elucidated that, when the crushed layer formed in this manner on the rear surface or the side surface of the semiconductor chip in the step of manufacturing the semiconductor device is remaining, the crushed layer serves as a cause of damaging the semiconductor chip in the environment of usage. It has been found out that the influence of reduction in the strength due to the crushed layer is large particularly in a thin semiconductor chip.

SUMMARY

The present invention has been made in view of the above-described problems, and a preferred aim of the present invention is to provide techniques of preventing or suppressing reduction in the strength of the semiconductor device.

The above and other preferred aims and novel characteristics of the present invention will be apparent from the description of the present specification and the accompanying drawings.

The typical ones of the inventions disclosed in the present application will be briefly described as follows.

More specifically, a method of manufacturing a semiconductor device which is an aspect of the present invention includes the step of (a) fixing a front surface of a semiconductor wafer to a supporting member, the semiconductor wafer having the front surface, a plurality of chip regions formed on the front surface, a dicing region formed between the chip regions adjacent to each other of the chip regions, and a rear surface opposite to the front surface. Also, the method includes the step of (b) grinding the rear surface of the semiconductor wafer in a state in which the semiconductor wafer is fixed to the supporting member. Also, the method includes the step of (c) dividing the semiconductor wafer into the chip regions in a state in which the semiconductor wafer is fixed to the supporting member. Also, the method includes the step of (d) after the step (c), etching a side surface of each of the plurality of divided chip regions so as to remove a crushed layer formed in the step (c) on the side surface of each of the chip regions. Moreover, the method includes the step of (e) after the step (d), peeling off the divided chip regions from the supporting member so as to obtain a plurality of semiconductor chips.

The effects obtained by typical aspects of the present invention will be briefly described below.

Thus, according to an aspect of the invention of the present application, reduction in the strength of a semiconductor chip can be prevented or suppressed.

BRIEF DESCRIPTIONS OF THE DRAWINGS

Figure 35:
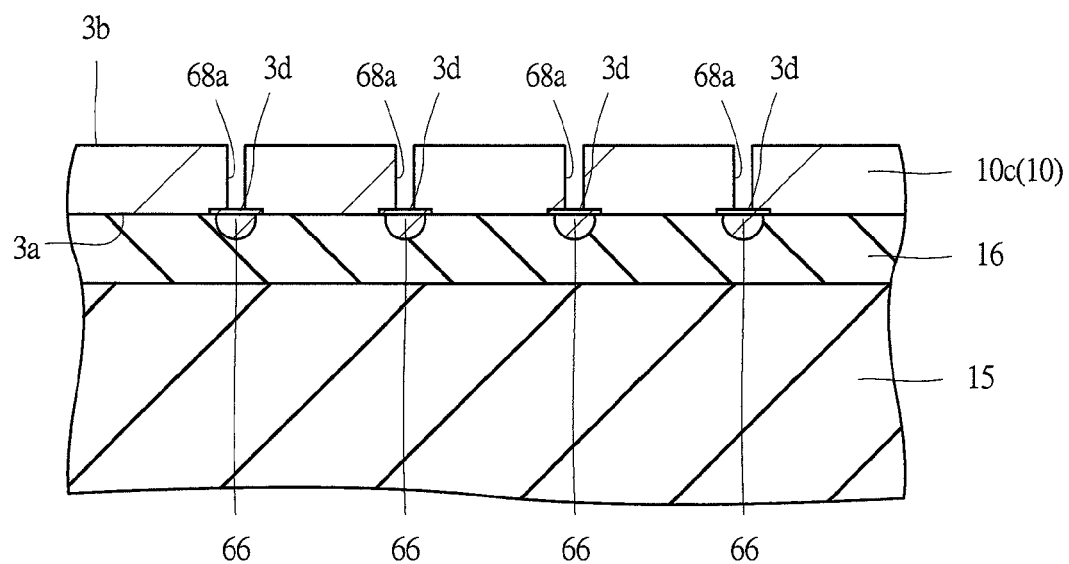
FIG. 35 is an enlarged cross-sectional view illustrating a through-hole forming step of forming through holes in the chip region of the semiconductor wafer after the rear-surface grinding step illustrated in FIG. 5.
Figure 36:
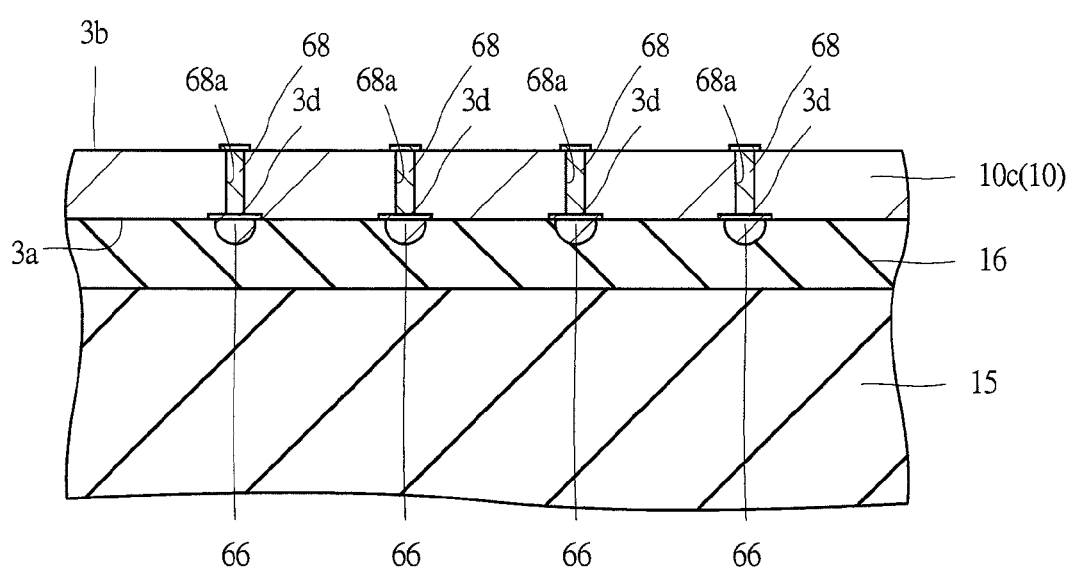
Figure 37:
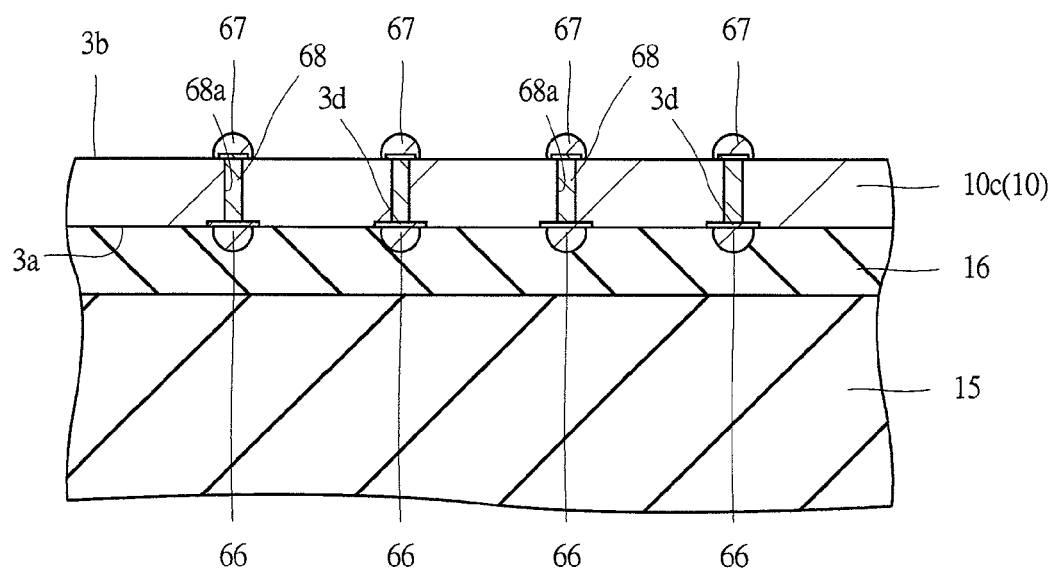

FIG. 36 is an enlarged cross-sectional view illustrating an electrically-conductive-member embedding step of embedding electrically-conductive members in the through holes after the through-hole forming step illustrated in FIG. 35; and FIG. 37 is an enlarged cross-sectional view illustrating a rear-surface-side projecting-electrode forming step of forming bump electrodes on the rear surface side of the chip region after the electrically-conductive-member embedding step illustrated in FIG. 36.

DETAILED DESCRIPTION (Explanations of Description Format, Basic Terms, and Usage in the Present Application)

In the present application, the descriptions of aspects are will be made separately in, for example, a plurality of sections for the sake of convenience in accordance with needs. However, unless otherwise explicitly stated, they are not mutually independent or separated regardless of the order of descriptions; for example, the descriptions are part of a single example, or one of them is a modification example of detailed part, or part or all of the others. In principle, repeated explanations of similar parts will be omitted. Unless otherwise explicitly stated, constituent parts in the aspects are not essential except for the case in which they are theoretically limited to the number and the case in which they are apparently essential.

Similarly, in the descriptions of the aspects, etc., for example, when "X is formed of A" regarding a material, composition, etc., the material or the like containing an element(s) other than A is not excluded unless otherwise explicitly stated and except for the case in which it is apparently excluded according to the context. For example, regarding a component, it means, for example, "X containing A as a main component". For example, it goes without saying that "silicon member" or the like is not limited to pure silicon, but includes SiGe (silicon/germanium) alloys, other multi-metal alloys mainly composed of silicon, and members including other additives, etc. Unless otherwise explicitly stated, gold plating, a Cu (copper) layer, nickel/plating, etc. do not mean they are pure members, but include members mainly composed of gold, Cu (copper), nickel, etc., respectively.

Furthermore, particular numerical values and numerical quantities may be numerical values exceeding the particular numerical values or may be the numerical values less than the particular numerical values unless otherwise explicitly stated or except for the case in which they are theoretically limited to the values and the case in which they are apparently limited to the values according to the context.

In the drawings of the embodiments, the same or similar parts are denoted by the same or similar symbols or reference numerals, and explanations thereof will not be basically repeated.

In the accompanying drawings, hatching or the like is omitted in some cases even in cross sections if the hatching or the like disadvantageously makes it complicated or if the difference thereof from space is clear. In relation to that, if apparent according to explanations, etc., the outline of the background is omitted in some cases even in the case of a planarly closed hole. Furthermore, even a part not being a cross section is sometimes denoted by hatching or a dot pattern in order to explicitly show that the part is not space or to explicitly show a boundary of a region.

Figure 1:
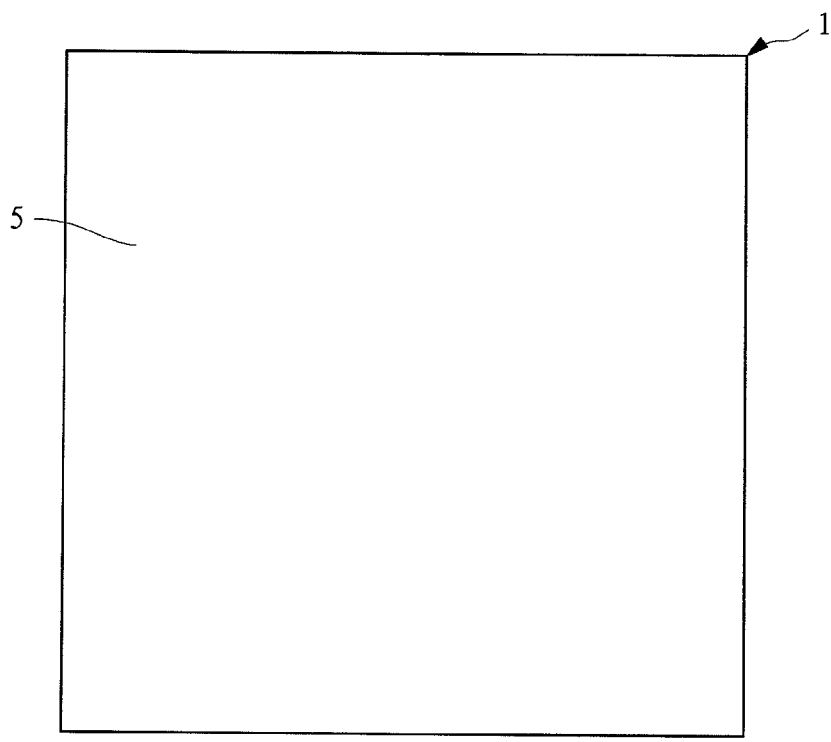
FIG. 1 is a top view of a semiconductor device which is an embodiment of the present invention.
Figure 2:
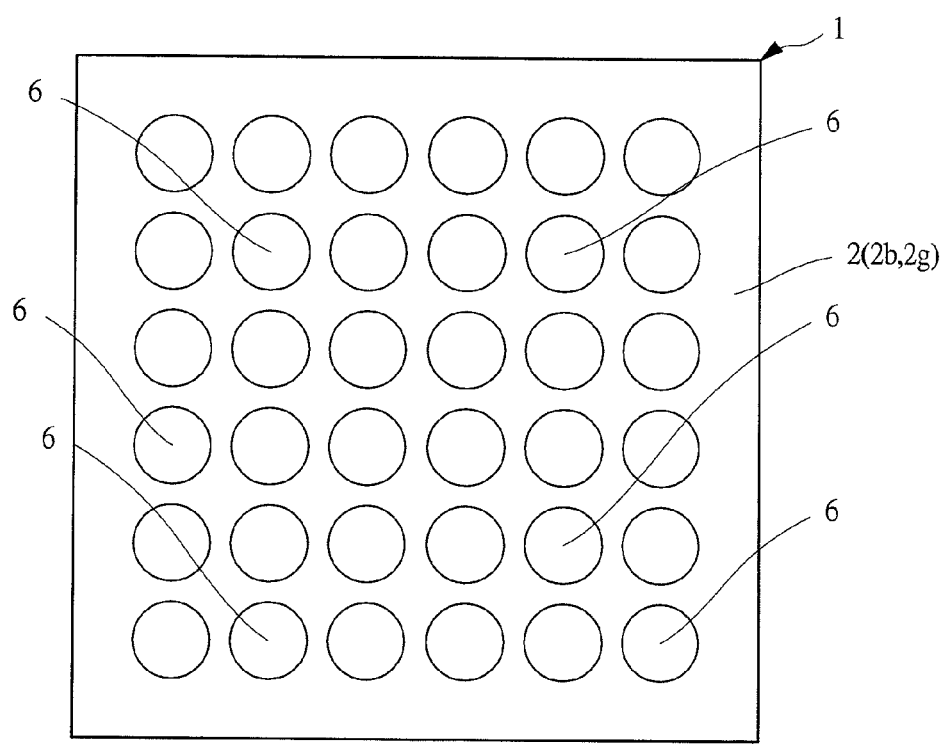
FIG. 2 is a bottom view of the semiconductor device illustrated in FIG. 1.
Figure 3:
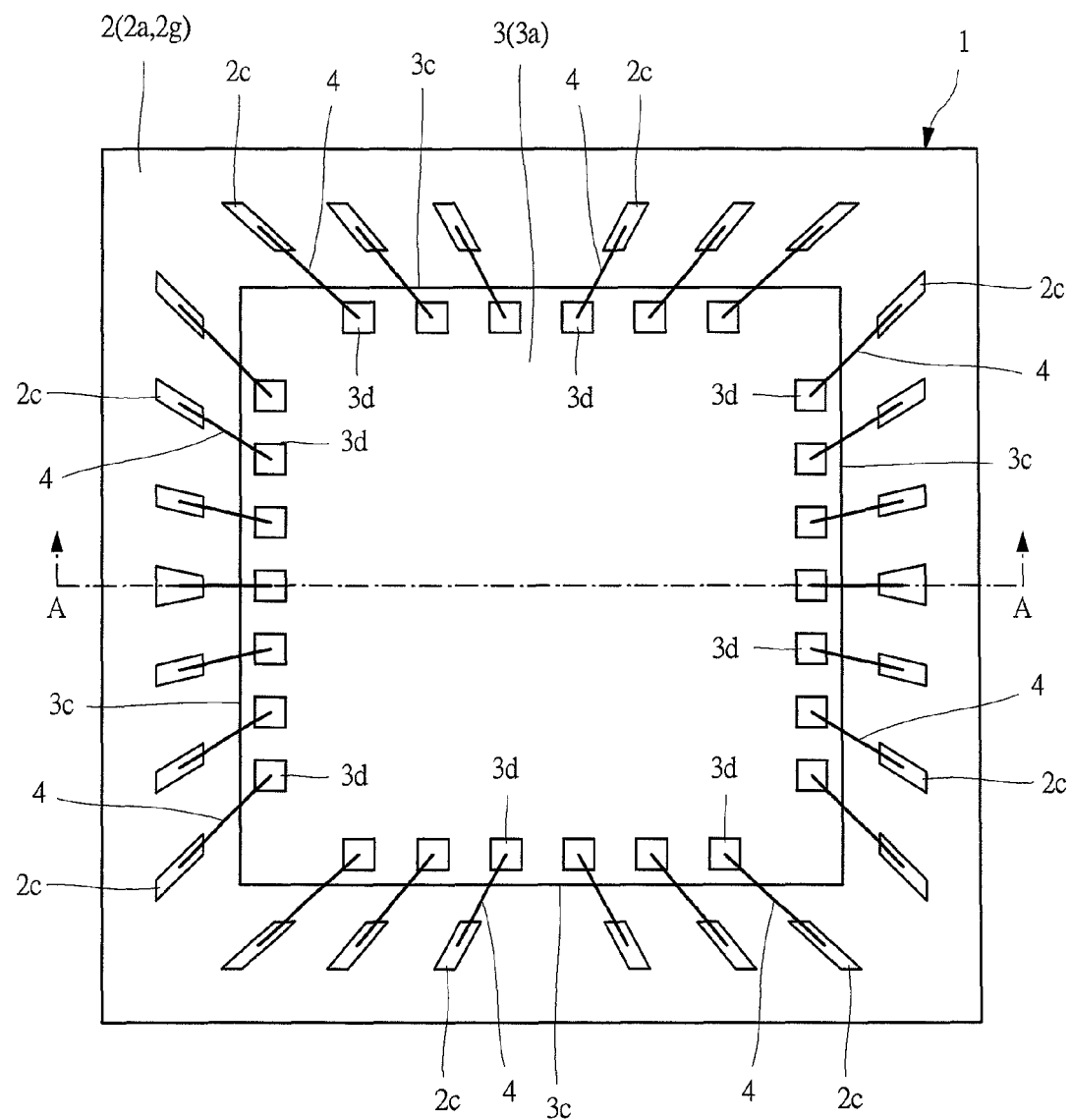
FIG. 3 is a plan view illustrating an internal structure of the semiconductor device illustrated in FIG. 1.

In the present embodiment, an aspect applied to a so-called area-array-type semiconductor device, in which a semiconductor chip is mounted on a wiring board having external terminals formed in a matrix on a lower surface serving as a packaging surface, will be described as an example of a semiconductor device. FIG. 1 is a top view of the semiconductor device of the present embodiment, FIG. 2 is a bottom view of the semiconductor device illustrated in FIG. 1, FIG. 3 is a plan view illustrating an internal structure of the semiconductor device illustrated in FIG. 1, and FIG. 4 is a cross-sectional view taken along the line A-A of FIG. 3.

<Semiconductor Device>

First, an outline of a configuration of a semiconductor device 1 of the present embodiment will be described with reference to FIGS. 1 to 4. As illustrated in FIG. 4, the semiconductor device 1 of the present embodiment is provided with: a wiring board 2; a semiconductor chip 3 mounted on the wiring board 2; and a plurality of wires (electrically-conductive members) 4 electrically connecting the semiconductor chip 3 and the wiring board 2. The semiconductor chip 3 and the plurality of wires 4 are sealed by a sealant (hardened resin body) 5 formed on an upper surface 2a of the wiring board 2. The sealant 5 illustrated in FIG. 1 and the wiring board 2 illustrated in FIGS. 2 and 3 form a quadrilateral (quadrangle) in a planar view.

Figure 4:
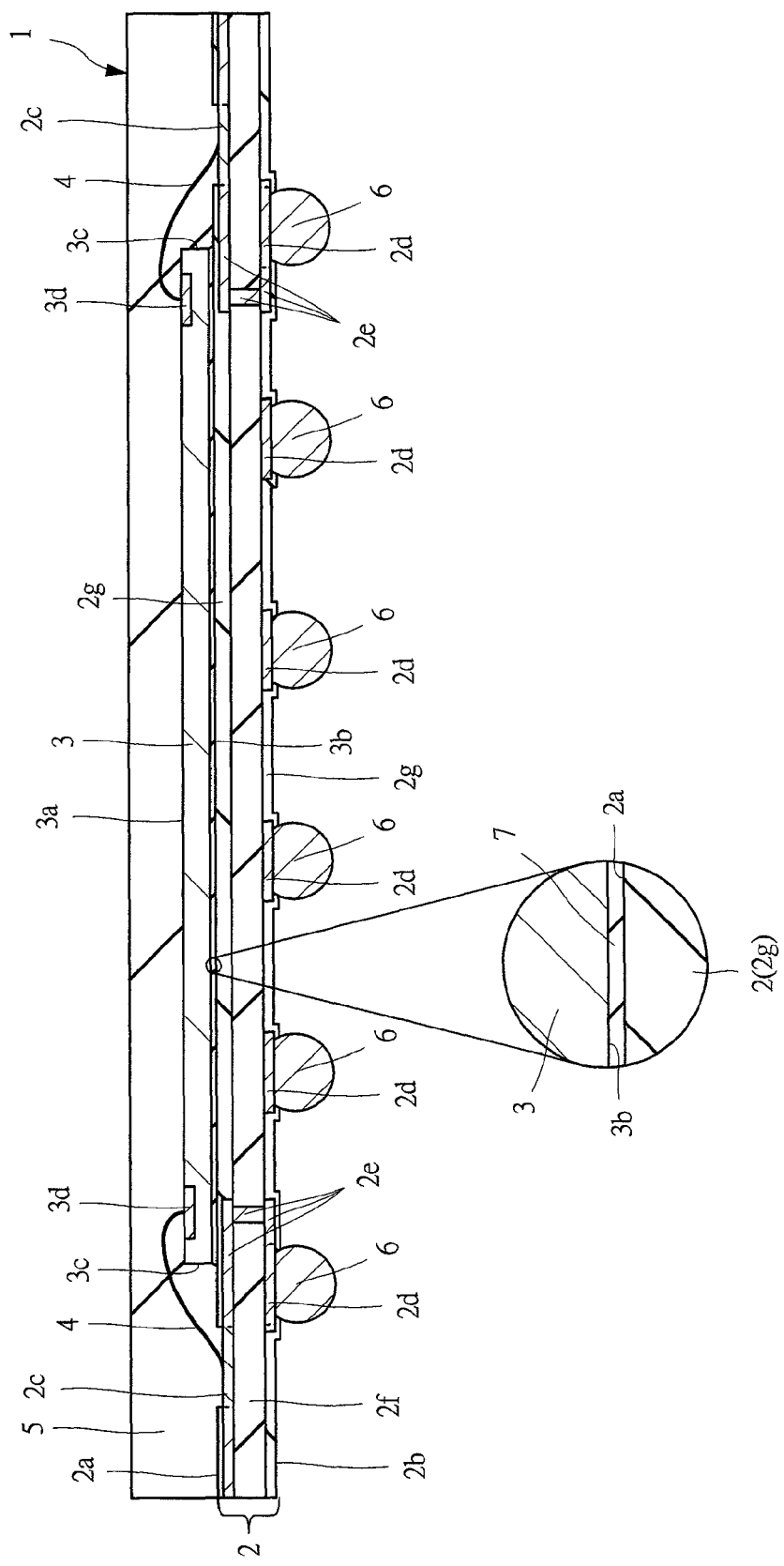
FIG. 4 is a cross-sectional view taken along the line A-A of FIG. 3.

As illustrated in FIG. 4, the wiring board 2 has an upper surface (chip mounting surface, front surface) 2a and a lower surface (packaging surface, rear surface) 2b positioned to be opposite to the upper surface 2a. A plurality of bonding leads (terminals for electrically connecting with the semiconductor chip 3) 2c are formed on the upper surface 2a of the wiring board 2, and a plurality of lands (terminals for electrically connecting with external devices) 2d are formed on the lower surface 2b. The plurality of bonding leads 2c and the plurality of lands 2d are electrically connected via a plurality of wirings 2e provided by the wiring board 2. The wiring board 2 is provided with a core layer 2f, which is an insulating layer composed of, for example, a molding material (prepreg) of glass fibers or carbon fibers impregnated with a resin, and insulating layers (solder resist films, protective films) 2g, which are respectively covering the upper surface and the lower surface of the core layer 2f. The upper surface 2a of the wiring board 2 is covered with the insulating film 2g, and at least part of the bonding leads 2c is exposed from the insulating film 2g at openings formed in the insulating film 2g. The lower surface 2b of the wiring board 2 is covered with the insulating film 2g, and at least part of the lands 2d is exposed from the insulating film 2g at openings formed in the insulating film 2g. The plurality of lands 2d are respectively joined with a plurality of solder balls (projecting electrodes) 6 serving as joining materials for electrically connecting the semiconductor device 1 with the external devices. As illustrated in FIG. 2, the plurality of solder balls 6 are disposed in a matrix on the rear surface of the wiring board 2. The semiconductor device 1, in which the solder balls 6 serving as external electrodes are disposed in this manner in a matrix on the lower surface 2b side of the wiring board 2, is called BGA (Ball Grid Array), in which the packaging area can be reduced by effectively utilizing the lower surface 2b of the wiring board 2 as space for disposing external electrodes.

The semiconductor chip 3 is mounted on the upper surface 2a of the wiring board 2. As illustrated in FIG. 4, the semiconductor chip 3 has a front surface (main surface, upper surface) 3a, a rear surface (main surface, lower surface) 3b opposite to the front surface 3a, and a side surface 3c positioned between the front surface 3a and the rear surface 3b. As illustrated in FIG. 3, the semiconductor chip 3 forms a quadrilateral (quadrangle) in a planar view. The thickness of the semiconductor chip 3 is, for example, 50 μm or less. A plurality of pads (electrodes, chip electrodes) 3d are formed on the front surface 3a of the semiconductor chip 3. The plurality of pads 3d are disposed on the peripheral side on the front surface 3a along the sides of the semiconductor chip 3.

A plurality of semiconductor elements (circuit elements) such as diodes and transistors are formed on the front surface 3a of the semiconductor chip 3 and electrically connected with a plurality of pads 3d, respectively, via unillustrated wirings (wiring layer) formed on the semiconductor elements. In this manner, the semiconductor chip 3 constitutes an integrated circuit by the plurality of semiconductor elements formed on the front surface 3a and the wirings electrically connecting the plurality of semiconductor elements. The base material (semiconductor substrate) having the front surface 3a serving as a semiconductor element formation surface of the semiconductor chip 3 is formed of, for example, silicon (Si). A passivation film (illustration omitted), which is an insulating film, is formed on the uppermost surface of the front surface 3a, and the surfaces of the plurality of pads 3d are exposed from the insulating film at openings formed in the passivation film. The pads 3d are formed of a metal and are, for example, formed of aluminum (Al) in the present embodiment. Furthermore, a plating film is formed on the surface of the pad 3d; for example, in the present embodiment, the film is a laminated plating film having a multi-layer structure in which a gold (Au) film is formed interposing a nickel (Ni) film.

In the present embodiment, the semiconductor chip 3 is mounted by a so-called face-up packaging method, wherein the chip is mounted on the wiring board 2 having the rear surface 3b being opposed to the upper surface 2a of the wiring board 2. The semiconductor chip 3 is fixed on the upper surface 2a of the wiring board 2 via an adhesive material (die bond material) 7. The adhesive material 7 is not particularly limited as long as the semiconductor chip 3 can be fixed onto the upper surface 2a of the wiring board 2; and, in the present embodiment, for example, an epoxy thermosetting resin is used.

As illustrated in FIGS. 3 and 4, the semiconductor chip 3 is electrically connected with the wiring board 2 via the plurality of wires 4. Specifically, one end of the wire 4 is connected to the pad 3d on the front surface 3a of the semiconductor chip 3, and the other end is connected to the bonding lead 2c of the wiring board 2. In the present embodiment, the wire 4 is formed of gold (Au) and is joined by Au—Au joining with gold plating films formed on the pad 3d of the semiconductor chip 3 and the upper surface (front surface) of the bonding lead 2c of the wiring board 2.

As illustrated in FIG. 4, the semiconductor device 1 is provided with the sealant 5 sealing the semiconductor chip 3, the plurality of wires 4, and the plurality of bonding leads 2c. The sealant 5 is a resin body, which is for example a mixture of a thermosetting resin and a filler material such as silica, and is formed so as to cover the entirety of the upper surface 2a of the wiring board 2.

Incidentally, when the semiconductor device 1 is packaged on a packaging substrate, which is not illustrated, and subjected to use, various external force is applied to the semiconductor chip 3 in some cases. For example, when a temperature cycle is generated in the semiconductor device 1, the wiring board 2 sometimes undergoes warping deformation due to a difference in linear expansion coefficient between the semiconductor chip 3 and the wiring board 2. In this case, stress caused by warping deformation is applied to the semiconductor chip 3. For example, if shock is applied to an electronic device on which the semiconductor device 1 is packaged, the shock is sometimes transmitted to the semiconductor chip 3. In the case in which a crushed layer including fine cracks of 1 μm or less is remaining on the rear surface 3b or the side surface 3c of the semiconductor chip 3, it has been found out that, when external force is applied to the semiconductor chip 3, the cracks are expanded from the crushed layer and serve as a cause of damaging the semiconductor chip 3. Particularly, it has been found out that, if a thickness of the semiconductor chip 3 is 50 μm or less, which is extremely thin, destruction of the semiconductor chip 3 caused by the crushed layer easily occurs. Therefore, in the present embodiment, in a step of manufacturing the semiconductor device 1, crushed layers formed on the rear surface 3b and the side surface 3c of the semiconductor chip 3 are removed. Therefore, even when the semiconductor chip 3 is formed to have a thickness of 50 μm or less, reduction in the strength of the semiconductor chip 3 can be prevented or suppressed. Therefore, destruction of the semiconductor chip 3 can be prevented or suppressed. Reasons of forming the crushed layers on the rear surface 3b and the side surface 3c of the semiconductor chip 3 and a specific method of removing the crushed layers will be described later in detail as a method of manufacturing the semiconductor device.

In the present embodiment, the semiconductor device 1 has been described as an example of the semiconductor device on which the semiconductor chip 3, which is thin, is mounted; however, the packaging aspect of the semiconductor chip 3 is not limited to the aspect illustrated in FIGS. 1 to 4, but can be applied to various modification examples. As a packaging example of the semiconductor chip 3, a plurality of semiconductor chips 3 can be stacked and mounted on the wiring board 2. In that case, if the thickness of the semiconductor chips 3 is reduced, increase in the thickness of the semiconductor device can be suppressed even when the plurality of semiconductor chips 3 are stacked on the wiring board 2. For example, an example can be applied to a semiconductor device of an aspect in which the semiconductor chip 3 is disposed (embedded) between the upper surface 2a and the lower surface 2b of the wiring board. In that case, increase in the thickness of the wiring board 2 can be suppressed by reducing the thickness of the semiconductor chip 3. The substrate on which the semiconductor chip 3 is mounted is not limited to the wiring board 2, but can be used to, for example, an aspect in which the chip is mounted on a chip-mounting part of a lead frame. The electrically-conducting members electrically connecting the semiconductor chip 3 and the substrate (for example, the wiring board 2) are not limited to the wires 4; for example, bump electrodes (projecting electrodes) formed of, for example, gold can be joined onto the pads 3d to electrically connect with the bonding leads 2c via the bump electrodes. In that case, the semiconductor chip 3 is mounted by the so-called face-down packaging method, in which the semiconductor chip 3 is mounted on the wiring board 2 in a state in which the upper surface 2a of the wiring board 2 and the front surface 3a of the semiconductor chip 3 are opposed to each other. Moreover, in that case, if the sealant 5 is not formed on the rear surface 3b side of the semiconductor chip 3, the thickness can be further reduced than the semiconductor device 1 illustrated in FIG. 4. For example, in the packaging method in which the plurality of semiconductor chips 3 are stacked, a plurality of electrodes (for example, projecting electrodes formed of solder) can be formed on each of the front surface 3a and the rear surface 3b of each of the semiconductor chips 3, and the electrodes of the plurality of semiconductor chips 3 can be directly and electrically connected. Also in the above-described modification examples, if the semiconductor chip 3 is 50 μm or less, destruction of the semiconductor chip 3 caused by the crushed layers may occur; however, this can be prevented or suppressed by removing the crushed layers in advance in the step of manufacturing the semiconductor device.

If the thickness of the semiconductor chip 3 is thicker than 50 μm, the semiconductor chip 3 is not easily broken; however, removing the crushed layers and suppressing reduction in the strength is effective since the semiconductor chip 3 is required to have a high strength depending on the use of the semiconductor device on which the semiconductor chip 3 is mounted. For example, if applied to a semiconductor device incorporated in an IC (Integrated Circuit) card, the semiconductor chip 3 in the semiconductor device is required to have a high bending strength or shock resistance strength; therefore, it is preferred to remove the crushed layers, for example, even in the case of the semiconductor chip 3 having a thickness of about 100 μm. For example, also in the case of application to the semiconductor device in which a driver circuit used in a display device such as an LCD (Liquid Crystal Display) is incorporated, a high bending strength or shock resistance strength is required; therefore, even if the semiconductor chip 3 has a thickness of, for example, about 100 μm, it is preferable to remove the crushed layers.

<Method of Manufacturing Semiconductor Device>

Figure 5:
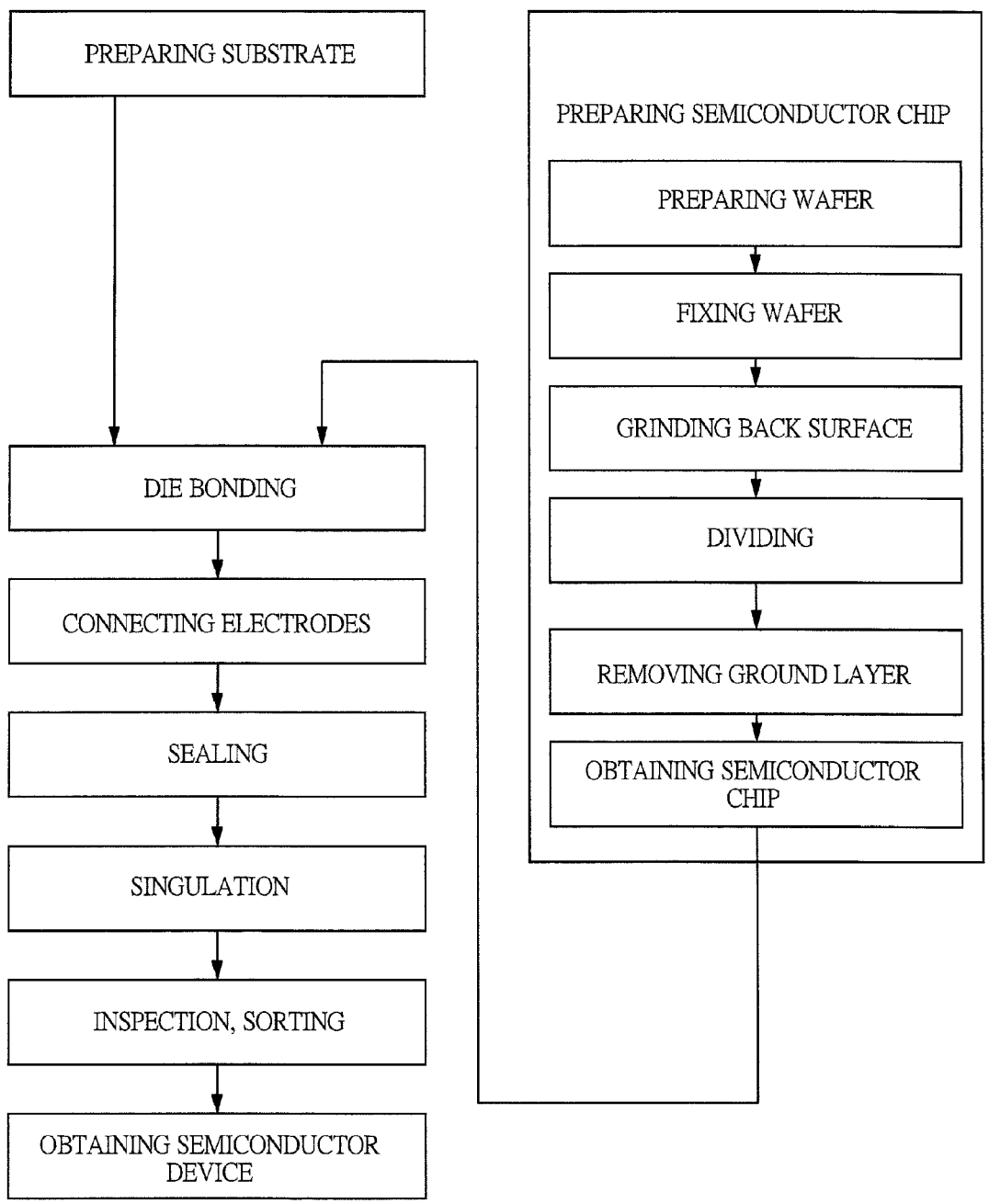
FIG. 5 is an explanatory diagram illustrating an outline of steps of manufacturing the semiconductor device which is an embodiment of the present invention.

Next, a method of manufacturing the semiconductor device of the present embodiment will be described. The semiconductor device 1 of the present embodiment is manufactured along a flow illustrated in FIG. 5. FIG. 5 is an explanatory diagram illustrating an outline of steps of manufacturing the semiconductor device of the present embodiment. Details of the steps will be described below with reference to FIGS. 6 to 23.

<Semiconductor Chip Preparing Step>

First, a semiconductor chip preparing step illustrated in FIG. 5 will be described. As illustrated in FIG. 5, the semiconductor chip preparing step includes a wafer preparing step, a wafer fixing step, a rear-surface grinding step, a dividing step, a crushed-layer removing step, and a chip obtaining step.

<Wafer Preparing Step>

Figure 6:
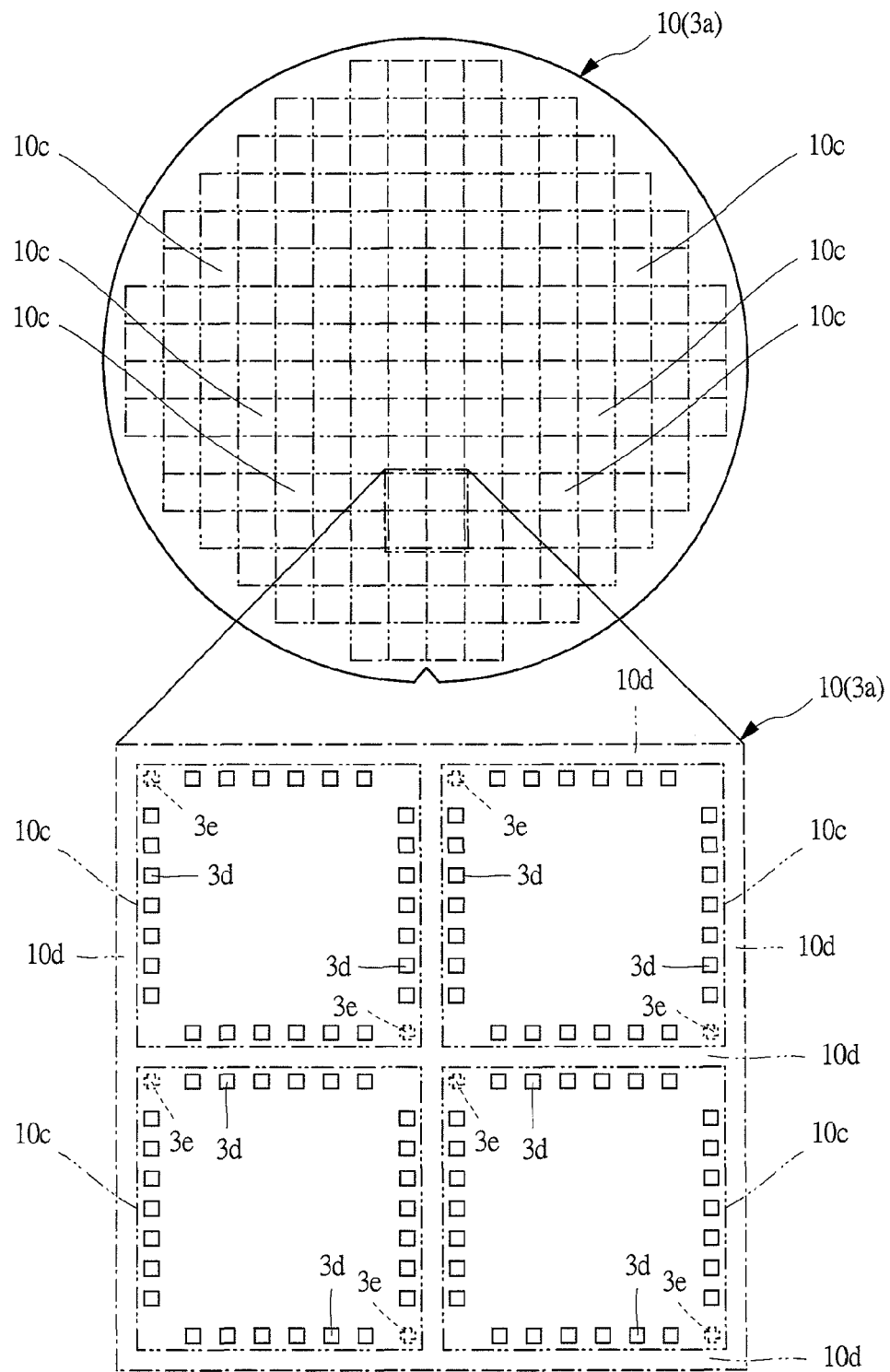
FIG. 6 is a plan view illustrating a flat surface on a main surface side of a semiconductor wafer prepared in a wafer preparing step illustrated in FIG. 5.
Figure 7:
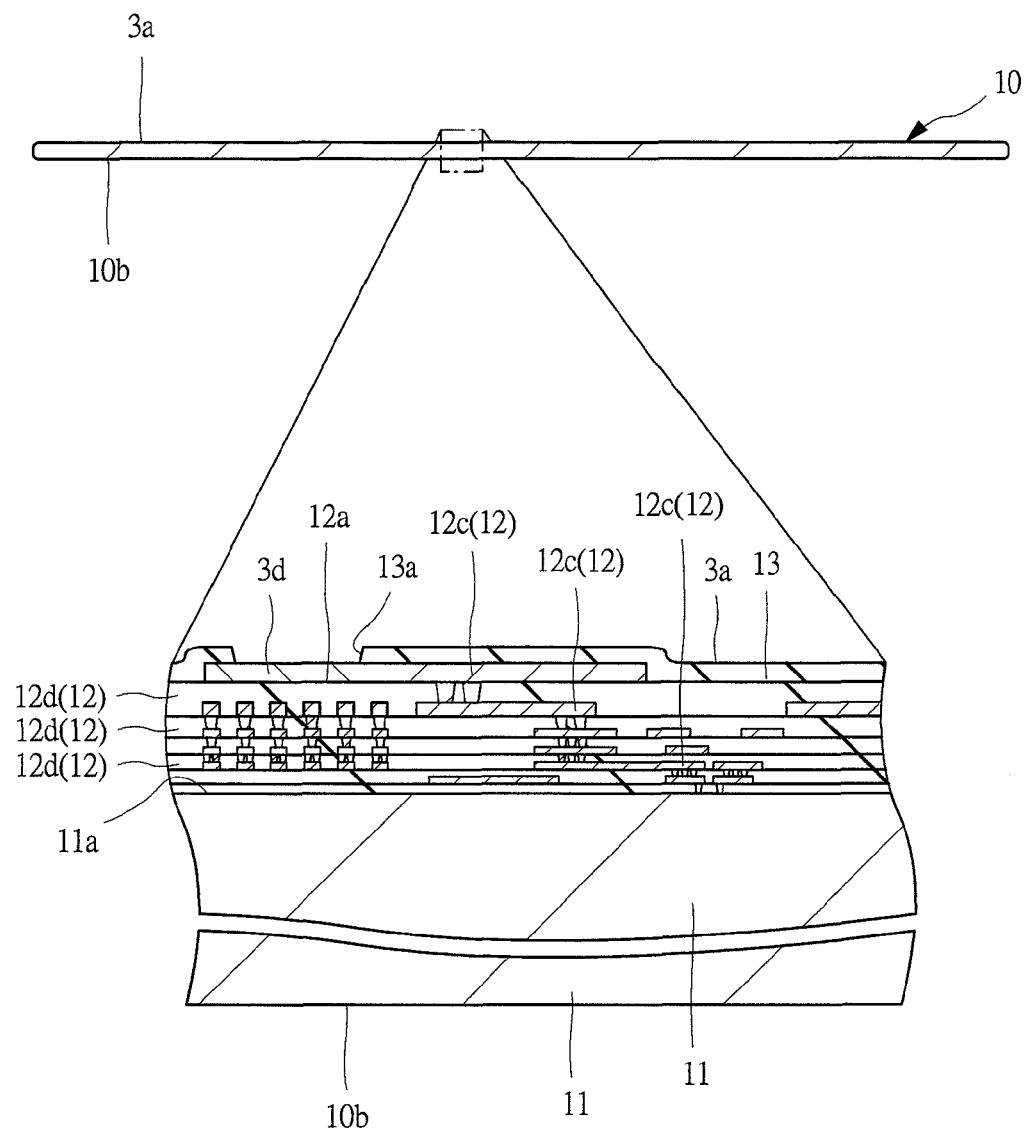
FIG. 7 is a cross-sectional view of the semiconductor wafer illustrated in FIG. 6.

In the wafer preparing step, a wafer 10 illustrated in FIGS. 6 and 7 is prepared. FIG. 6 is a plan view illustrating a flat surface on the main surface side of the semiconductor wafer prepared in the wafer preparing step illustrated in FIG. 5. FIG. 7 is a cross-sectional view of the semiconductor wafer illustrated in FIG. 6.

The wafer 10 has a substantially-circular planar shape and has a front surface (main surface, upper surface) 3a and a rear surface (main surface, lower surface) 10b opposite to the front surface 3a (see FIG. 7). For example, in the present embodiment, the wafer 10 illustrated in FIGS. 6 and 7 has a diameter of 300 mm and a thickness of 775 μm. Note that the front surface 3a of the wafer 10 corresponds to the front surface 3a of the semiconductor chip 3 illustrated in FIG. 4. The wafer 10 also has a plurality of chip regions 10c, which are formed on the front surface 3a, and dicing regions 10d, which are formed between the mutually adjacent chip regions 10c among the plurality of chip regions 10c. Each of the plurality of chip regions 10c corresponds to the semiconductor chip 3 described with reference to FIGS. 3 and 4, and a plurality of semiconductor elements and a plurality of pads 3d electrically connected with the semiconductor elements are formed on the main surface on the surface side.

The wafer 10 illustrated in FIG. 7 is formed, for example, in the following manner. First, a semiconductor substrate (for example, a silicon wafer) 11 having a main surface 11a, which is a semiconductor element formation surface, and a rear surface 10b, which is opposite to the main surface 11a, is prepared, and a plurality of semiconductor elements (illustration omitted) are formed in the semiconductor element formation region of the main surface 11a. Next, wiring layers 12 composed of wirings 12c and insulating layers (interlayer insulating films) 12d are formed on the main surface 11a so as to electrically connect the plurality of wirings 12c formed in the wiring layer 12 and the plurality of semiconductor elements formed on the main surface 11a. Then, the surface wiring (wiring 12c) and the pads 3d are formed on the upper surface 12a of the wiring layer 12. In this process, the surface wiring and the pads 3d are integrally formed. Then, an insulating layer (called a passivation film, for example, a silicon oxide film, a silicon nitride film, or a laminated film thereof) 13 is formed on the wiring layer 12; and, after the wiring layer 12 is covered, openings 13a are formed in the insulating layer 13 by an etching method so as to expose part of the pads 3d from the insulating layer 13. The upper surface of the insulating layer 13 serves as the front surface 3a of the wafer 10 illustrated in FIGS. 6 and 7. Then, before dividing the wafer, examinations such as electrical tests of the integrated circuits formed in the chip regions are carried out so as to obtain the wafer 10.

<Wafer Fixing Step>

Figure 8:
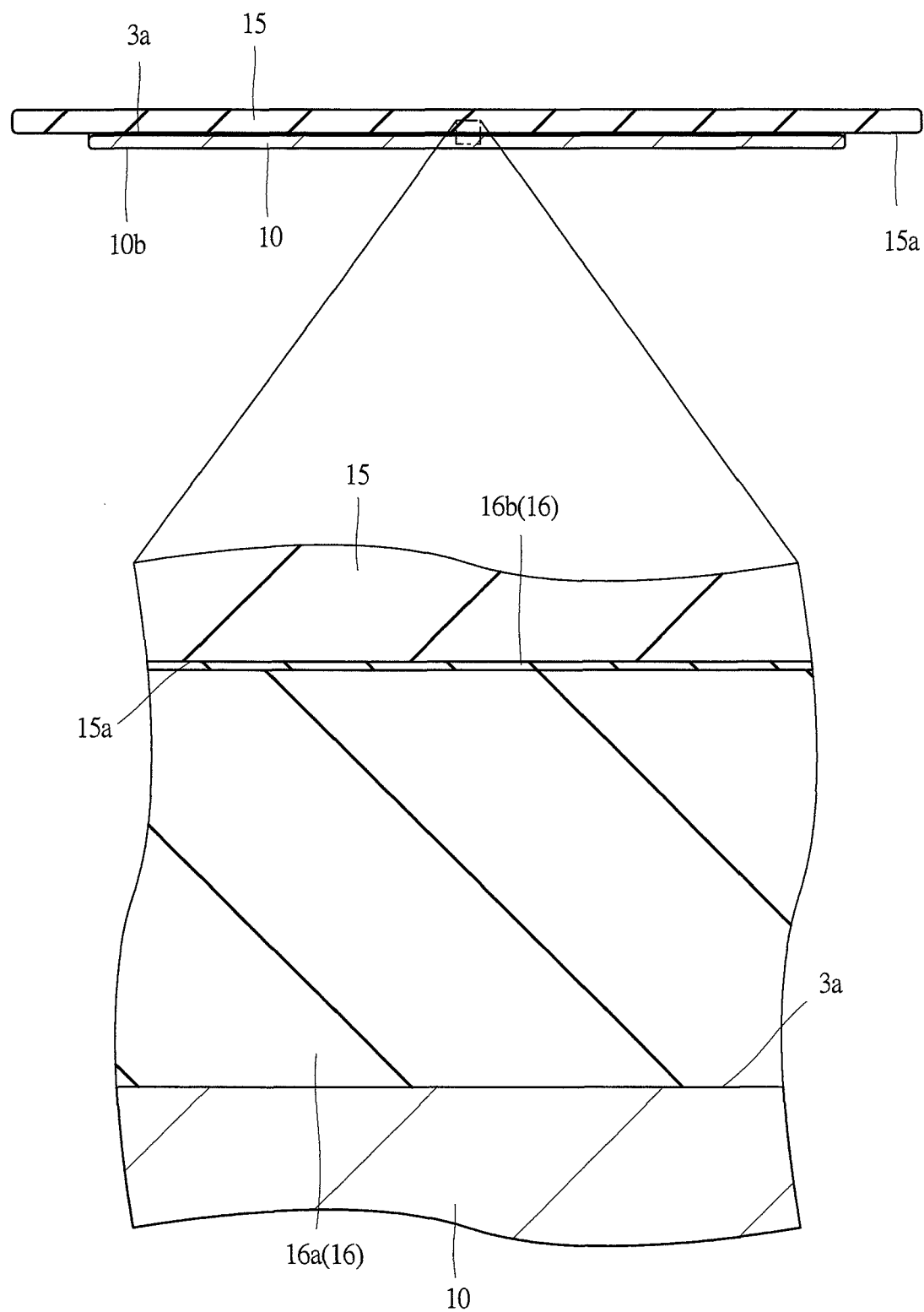
FIG. 8 is a cross-sectional view illustrating a state in which the semiconductor wafer illustrated in FIG. 7 is fixed by a supporting member.

Then, in the wafer fixing step, as illustrated in FIG. 8, the wafer 10 is fixed on a supporting member 15. FIG. 8 is a cross-sectional view illustrating a state in which the semiconductor wafer illustrated in FIG. 7 is fixed on the supporting member. In the rear-surface grinding step and the dividing step illustrated in FIG. 5, the wafer 10 is subjected to processing in a state in which the wafer 10 is fixed on a processing stage. Therefore, in order to protect the front surface 3a of the wafer 10 upon processing, before the rear-surface grinding step and the dividing step, the wafer 10 is bonded and fixed to the supporting member 15 via a bonding material 16 in a state in which the front surface 3a of the wafer 10 is opposed to a bonding surface (lower surface in FIG. 8) 15a of the supporting member 15. From the viewpoint of protecting the front surface 3a of the wafer 10 upon processing, a method in which processing is carried out in a state that an adhesive tape (called back grind tape or dicing tape) formed of an adhesive material (sticking material) disposed on one surface of a resin film (base material) is pasted on the front surface 3a of the wafer 10 can be used. In other words, a method of using the above-described adhesive tape as the supporting member can be used. However, in the present embodiment, in the rear-surface grinding step described later, the rear surface 10b of the wafer 10 is ground until the thickness of the wafer 10 becomes, for example, 50 μm or less. In the case of reducing the thickness of the wafer 10 to 50 μm or less in this manner, deformation or damage of the wafer 10 has to be suppressed during processing or upon handling between processing steps.

To prevent or suppress deformation of the thinned wafer 10, the supporting member 15 is preferable to be a member having a higher rigidity (supporting strength) than the thinned wafer 10. The reason therefor is that, if the rigidity of the member is lower than that of the wafer 10 like the resin film, deformation or damage of the wafer 10 cannot be sufficiently suppressed. Therefore, a glass plate thicker than the wafer 10 and having a hardness equivalent to that of the wafer 10 is used as the supporting member 15. For example, in the present embodiment, while the thickness of the wafer 10 is about 700 μm to 800 μm, the thickness of the supporting member 15 is about 1 mm to 2 mm. Thus, damage of the wafer 10 due to stress in the rear-surface grinding step or dividing step described later can be prevented or suppressed. Although details will be described later, in the present embodiment, a laminated body of an ultraviolet curable resin layer 16a and a photothermal conversion (Light to Heat Conversion: LTHC) layer 16b is used as the bonding material 16, and, from the viewpoint of improving the transmission efficiency of ultraviolet rays and laser light, it is preferable to use a glass plate having a higher transmittance of ultraviolet rays and visible light than the semiconductor substrate (for example, silicon) constituting the wafer 10. However, if the steps from fixation of the wafer 10 onto the supporting member 15 until removal do not include a process of irradiating the bonding material 16 or the front surface 3a side of the wafer 10 with ultraviolet rays or laser light (for example, if a thermosetting resin is used instead of the ultraviolet curable resin layer 16a), a member (for example, a silicon substrate) having a lower transmittance than the glass plate can be used.

In the present embodiment, the bonding material 16 bonding and fixing the supporting member 15 and the wafer 10 to each other is, for example, a laminated body of the ultraviolet curable resin layer 16a serving as a main material and the photothermal conversion layer 16b thinner than the ultraviolet curable resin layer 16a as a peeling material upon peel-off of the supporting member 15. When the ultraviolet curable resin layer 16a serving as the main material of the bonding material 16 is hardened, the layer can be harder than the adhesive material (sticking material) of the above-described adhesive tape. Therefore, when the wafer 10 is thin, deformation can be suppressed. If the adhesive material or the sticking material is used as the bonding material 16, the adhesive material (sticking material) may remain on the pads 3d (see FIG. 7) exposed from the front surface 3a of the wafer 10; however, this can be suppressed by disposing the hard ultraviolet curable resin layer 16a on the bonding interface side of the bonding material 16 and the wafer 10.

Figure 9:
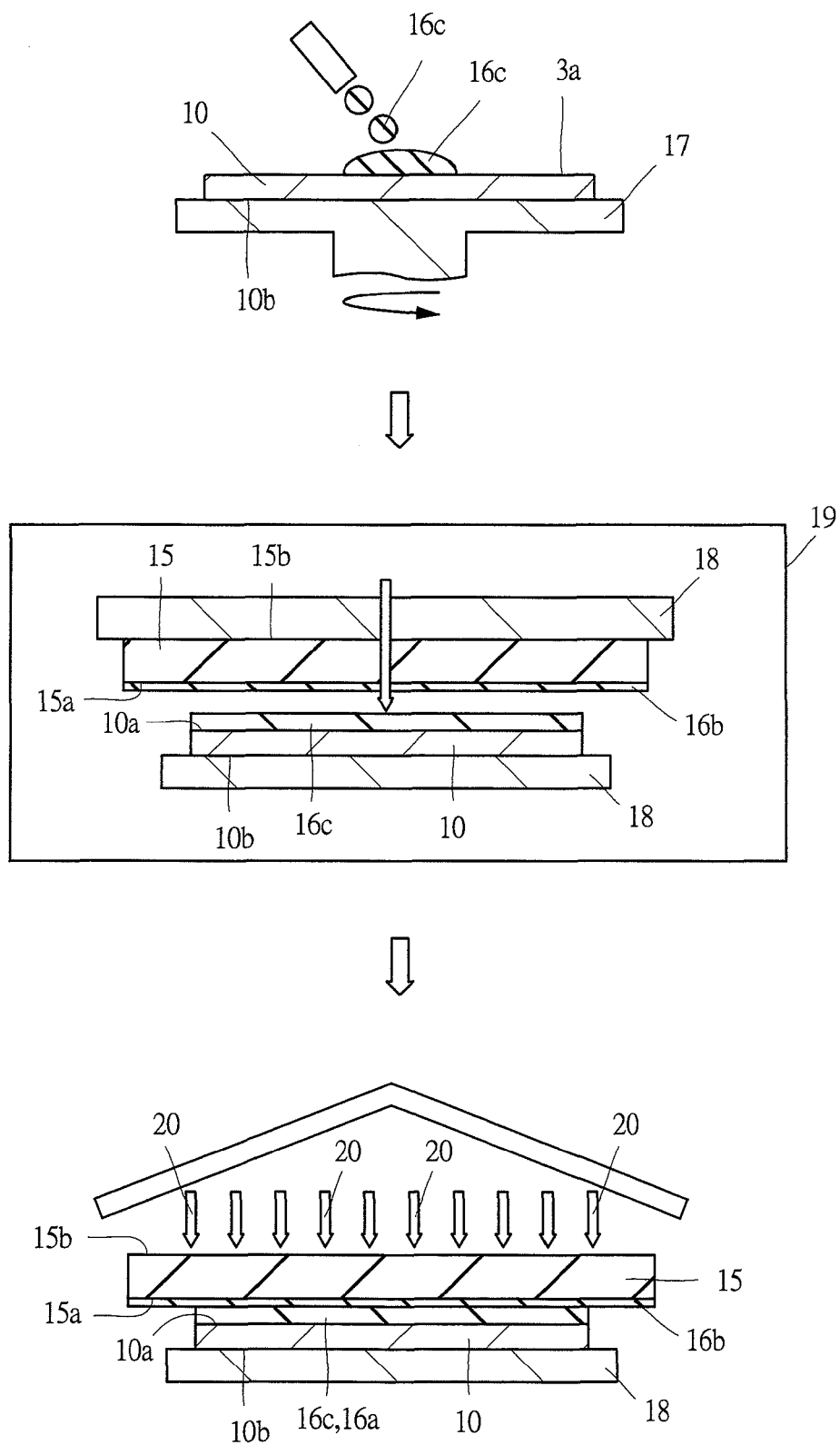
FIG. 9 is an explanatory diagram schematically illustrating a flow of a wafer fixing step illustrated in FIG. 5.
Figure 10:
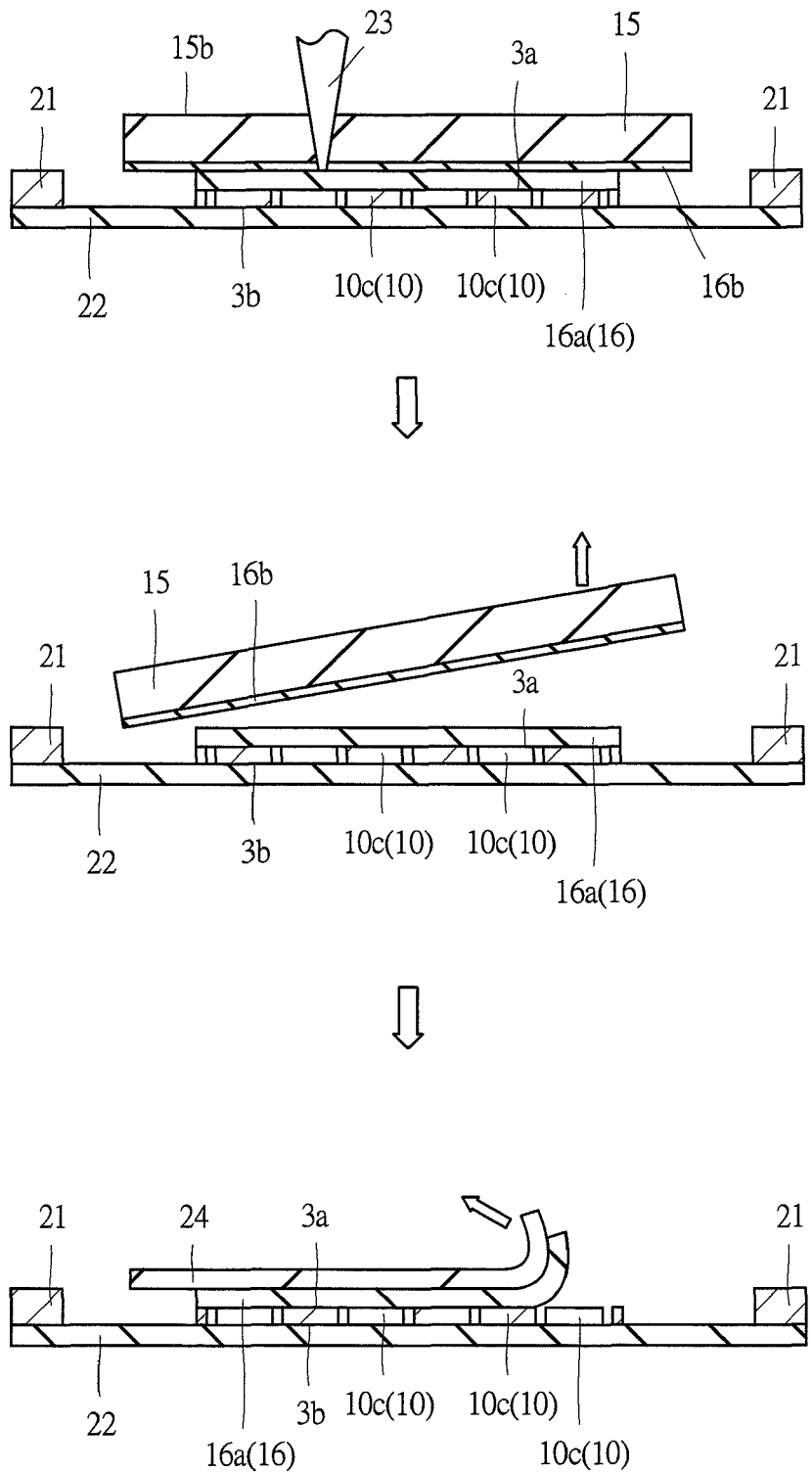
FIG. 10 is an explanatory diagram schematically illustrating a flow of a supporting-member peeling step in a semiconductor-chip obtaining step illustrated in FIG. 5.

Next, the wafer fixing step of fixing the wafer 10 onto the supporting member 15 and a supporting-member peeling step of peeling off the supporting member 15 from the wafer 10 will be described by using FIGS. 9 and 10. The supporting-member peeling step illustrated in FIG. 10 is a step carried out after the crushed-layer removing step illustrated in FIG. 5 (in a semiconductor chip obtaining step); however, this step will be described together with the wafer fixing step since it is easier to understand when described together. FIG. 9 is an explanatory diagram schematically illustrating the flow of the wafer fixing step illustrated in FIG. 5, and FIG. 10 is an explanatory diagram schematically illustrating the flow of the supporting-member peeling step in the semiconductor-chip obtaining step illustrated in FIG. 5.

In the wafer fixing step illustrated in FIG. 9, first, the ultraviolet curable resin 16c is applied to the front surface 3a of the wafer 10, and the photothermal conversion layer 16b is applied to the bonding surface 15a of the supporting member 15. As a result, the front surface 3a of the wafer 10 is covered with the ultraviolet curable resin 16c, and the bonding surface 15a of the supporting member 15 is covered with the photothermal conversion layer 16b. In the present embodiment, the wafer is fixed (for example, fixed by suction) on a stage (stage 17) in a state in which the rear surface 10b of the wafer 10 is opposed to the stage, and the (liquid) ultraviolet curable resin 16c before curing is applied by a thickness of, for example, about 50 μm by a spin coating method. On the other hand, the photothermal conversion layer 16b to be applied to the bonding surface 15a of the supporting member 15 is applied by a thickness of, for example, about 1 μm by a printing method, spin coating method, or the like. The application method is not limited to those described above as long as the front surface 3a of the wafer 10 and the bonding surface 15a of the supporting member 15 can be reliably covered by predetermined thicknesses, respectively, by the application method.

Next, the ultraviolet curable resin 16c applied to the front surface 3a of the wafer 10 and the photothermal conversion layer 16b applied to the bonding surface 15a of the supporting member 15 are brought into close contact with each other. In other words, the front surface 3a of the wafer 10 and the bonding surface 15a of the supporting member 15 are bonded to each other via the bonding material 16 before curing.

In the present step, in the state in which the rear surface 10b of the wafer 10 and the surface 15b opposite to the bonding surface 15a of the supporting member 15 are retained by retainers 18, respectively, the front surface 3a and the bonding surface 15a are disposed to be opposed to each other, and the wafer 10 and the supporting member 15 are caused to approach each other, thereby bringing them into close contact with each other. In this process, in order to suppress generation of air bubbles in the close-contact interface of the ultraviolet curable resin 16c and the photothermal conversion layer 16b, it is preferable that the present step is carried out, for example, in a vacuum chamber (decompression chamber) 19.

Then, ultraviolet rays 20 are radiated from the surface 15b side of the supporting member 15 toward the ultraviolet curable resin 16c, thereby curing the ultraviolet curable resin 16c and obtaining the ultraviolet curable resin layer 16a. Through the above-described steps, as illustrated in FIG. 8, the wafer 10 can be bonded and fixed to the supporting member 15 via the bonding material 16 in a state in which the front surface 3a of the wafer 10 is opposed to the bonding surface (lower surface in FIG. 8) 15a of the supporting member 15.

On the other hand, in the supporting-member peeling step illustrated in FIG. 10, first, a fixing tape (adhesive tape) 22 supported by a frame (for example, ring frame) 21 is pasted and fixed to the rear surface 3b of the wafer 10 bonded and fixed to the supporting member 15. The fixing tape 22 is an adhesive tape in which an adhesive material (sticking material) is disposed on the surface opposed to the wafer 10 of the resin film (base material), the adhesive tape (dicing tape) being used generally upon dicing of a semiconductor wafer, can be used. At this point, the wafer 10 has already undergone the dividing step, the rear-surface grinding step, and the crushed-layer removing step (details will be described later) illustrated in FIG. 5, where the wafer has been singulated per the chip regions 10c and is in a state in which they are coupled via the bonding material 16 and the supporting member 15. In the rear surface of the wafer 10, the rear surface 3b positioned on the front surface 3a side is exposed than the rear surface 10b illustrated in FIG. 9. The rear surface 3b corresponds to the rear surface 3b of the semiconductor chip 3 described by using FIG. 4.

Then, the photothermal conversion layer 16b is irradiated with light, thereby causing a photothermal conversion substance in the photothermal conversion layer 16b to absorb light and generate air bubbles in the bonding interface between the photothermal conversion layer 16b and the ultraviolet curable resin layer 16a. In the present embodiment, in order to efficiently generate the air bubbles, YAG laser is used as a light source, and laser 23 is radiated from the supporting member 15 side. As a result, the bonding strength of the bonding interface between the photothermal conversion layer 16b and the ultraviolet curable resin layer 16a is reduced, and the supporting member 15 and the ultraviolet curable resin layer 16a can be easily peeled off from each other.

Then, a peeling tape (adhesive tape) 24 is pasted onto the ultraviolet curable resin layer 16a, and the ultraviolet curable resin layer 16a is peeled off from the front surface 3a of the wafer 10 together with the peeling tape 24. The peeling tape 24 is an adhesive tape in which an adhesive material (sticking material) is disposed on the surface opposed to the ultraviolet curable resin layer 16a of the resin film (base material) and is provided with a bonding strength equivalent to that of the fixing tape 22. At this point, the bonding strength between the ultraviolet curable resin layer 16a and the front surface 3a of the wafer 10 is lower than the bonding strength between the fixing tape 22 and the wafer 10 and the bonding strength between the peeling tape 24 and the ultraviolet curable resin layer 16a; therefore, it can be easily peeled off. The ultraviolet curable resin layer 16a after curing is harder than the adhesive material or the sticking material as describe above; therefore, adhesion onto the surface of the pads 3d (see FIG. 7) can be suppressed.

As described above, in the present embodiment, the method of fixing the wafer 10 to the supporting member 15 particularly suitable for the aspect in which the thickness of the wafer 10 is ground to 50 μm or less has been described. However, in the case in which the thickness of the wafer 10 is not reduced to 50 μm or less and the wafer 10 alone has sufficient rigidity as a modification example with respect to the present embodiment, an adhesive tape in which an adhesive material (sticking material) is disposed on one surface of a resin film (base material) can be also used. In that case, the adhesive material functions as the bonding material 16.

<Rear-Surface Grinding Step>

Figure 11:
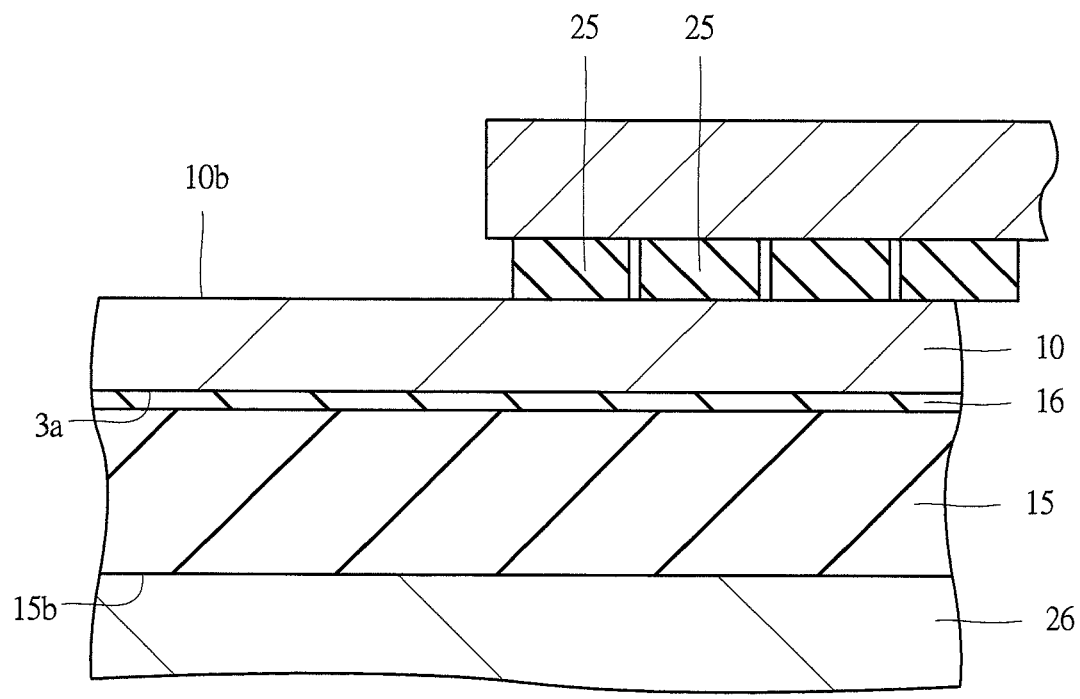
FIG. 11 is an enlarged cross-sectional view illustrating a rear-surface grinding step illustrated in FIG. 5.
Figure 12:
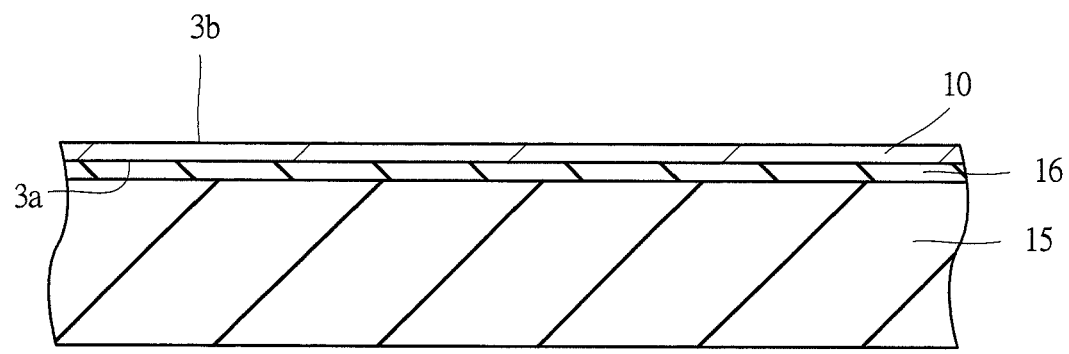
FIG. 12 is an enlarged cross-sectional view illustrating a state of a wafer after the rear-surface grinding illustrated in FIG. 11.

Then, in the rear-surface grinding step, as illustrated in FIGS. 11 and 12, the rear surface 10b of the wafer 10 (see FIG. 11) is ground in a state in which the wafer 10 is fixed to the supporting member 15 so as to expose the rear surface 3b (see FIG. 12) positioned more on the front surface 3a side than the rear surface 10b. FIG. 11 is an enlarged cross-sectional view illustrating the rear-surface grinding step illustrated in FIG. 5, and FIG. 12 is an enlarged cross-sectional view illustrating the state of the wafer after the rear-surface grinding illustrated in FIG. 11.

In the present step, the rear surface side is ground until the thickness of the wafer 10 becomes the thickness of the semiconductor chip 3 illustrated in FIG. 4 (for example, 50 μm or less) (until the position of the rear surface 3b illustrated in FIG. 12). As a method of obtaining the semiconductor chip 3 having a small thickness, a method in which the thickness of the wafer (silicon wafer in the present embodiment) serving as a base material is reduced in advance is conceivable. However, in that case, if the thickness is extremely reduced, the handling ability is lowered in the steps of forming semiconductor elements, etc. on the wafer serving as the base material, causing damage on the wafer. If the thickness of the wafer is reduced, warping deformation occurs in some cases, and processing precision is reduced. Therefore, in the present embodiment, in the wafer preparing step and the wafer fixing step, from the viewpoint of suppressing reduction in the handling ability and warping deformation suppression, a wafer having a sufficient first thickness (for example, 700 μm to 800 μm) is subjected to processing, and the rear surface 10b side is then ground so as to have a second thickness (for example, 50 μm or less) thinner than the first thickness. As a result, the thickness of the obtained semiconductor chip 3 (see FIG. 4) can be reduced while preventing damage of the wafer during the manufacturing steps (steps of forming semiconductor elements, etc.). After the thickness of the wafer 10 becomes 10 μm or less, the wafer is conveyed in a state in which the supporting member 15 having higher rigidity than the wafer 10 is fixed thereon via the bonding material 16; therefore, reduction in the handling ability of the wafer 10 or warping deformation can be suppressed.

The grinding method in the present step is not particularly limited; however, in the present embodiment, for example, the rear surface 10b of the wafer 10 is ground by a grinding member 25 such as a grinding stone as illustrated in FIG. 11. FIG. 11 illustrates an aspect in which the supporting member 15 is directly held by suction by a holding jig 26 serving as a working stage of a grinding device so as to carry out the rear-surface grinding step; however, to protect the supporting member 15, an adhesive tape (fixing tape), which is not illustrated, can be pasted on the front surface 15b side of the supporting member 15 so as to fix the supporting member 15 via the adhesive tape. To prevent a residue upon grinding from remaining on the rear surface 3b of the wafer 10 after grinding, it is preferable to subject the rear surface 3b to polishing processing by using, for example, abrasive particles (illustration omitted). In the present step, grinding processing is carried out with supplying, for example, a grinding fluid (such as water), which is not illustrated, to the rear surface 10b side of the wafer 10. This grinding fluid is spread to the periphery of the wafer 10 together with the grinding dust; however, since the front surface 3a side of the wafer 10 is covered with the bonding material 16, the consequence that the grinding fluid and the grinding dust enter and contaminate the front surface 3a side of the wafer 10 can be suppressed. Also, there is a method in which a protective tape (adhesive tape in which an adhesive material (sticking material) is disposed on one surface of a resin film) called a back grind tape is pasted on the front surface 3a instead of the supporting member 15 to carry out the grinding process; however, adhesiveness between the bonding material 16 with the front surface 3a of the wafer 10 is higher than that with the adhesive material of the protective tape; therefore, a high contamination suppressing effect can be obtained.

Figure 13:
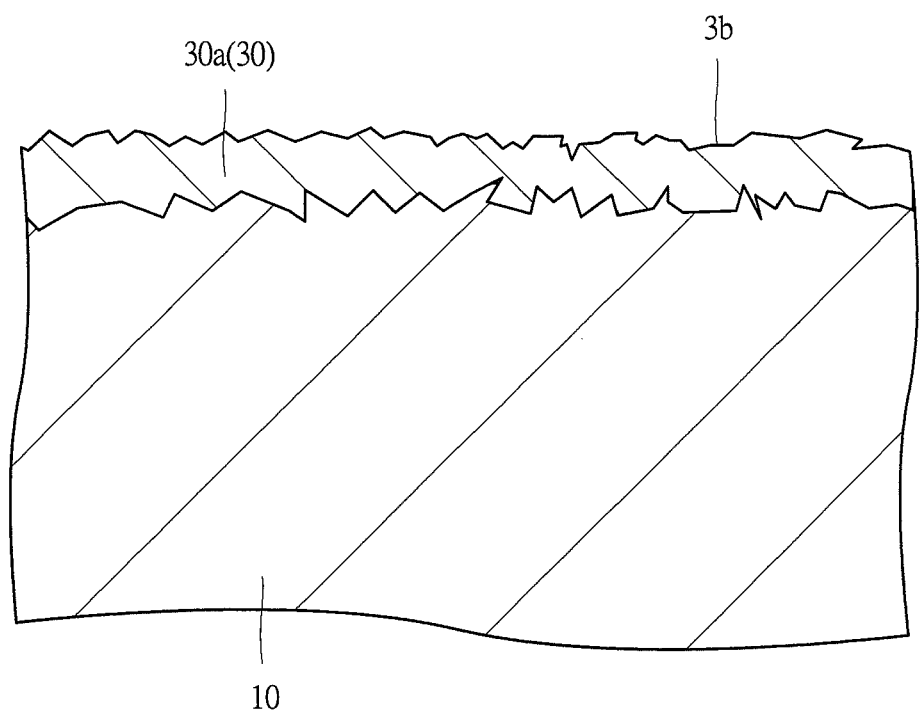
FIG. 13 is an enlarged cross-sectional view illustrating a rear surface side of the wafer illustrated in FIG. 12 in an enlarged manner.

Herein, in the present step, when the rear surface 10b of the wafer 10 is ground so as to expose the rear surface 3b, a crushed layer (rear-surface-side crushed layer) 30a caused by the rear-surface grinding process is formed on the rear surface 3b after the grinding process (or after polishing process) as illustrated in FIG. 13. FIG. 13 is an enlarged cross-sectional view illustrating the rear surface side of the wafer illustrated in FIG. 12 in an enlarged manner. The crushed layer 30a is a layer in which fine fractures (cracks) are formed upon the rear-surface grinding process, and the crushed layer is formed, for example, on the entire rear surface 3b, which has undergone the grinding process, by a thickness of about 500 nm to 1 µm. Then, as described above, when it is made into a product in the state in which the crushed layer 30a is remaining on the rear surface 3b of the semiconductor chip 3 (see FIG. 4), the fractures expand from the crushed layer 30a and serve as a cause of damaging the semiconductor chip 3. Therefore, the crushed layer 30a has to be removed before the semiconductor chip 3 is embedded into the semiconductor device 1 (see FIG. 4). The step of removing the crushed layer 30a can be also carried out before the dividing step; however, in the present embodiment, the crushed-layer removing step is carried out after the dividing step as illustrated in FIG. 5 since the crushed layer 30a illustrated in FIG. 13 can be collectively removed together with the crushed layer generated in the dividing step, which will be described later. As a result, the manufacturing step can be shortened, and manufacturing efficiency can be improved. If increase in the number of manufacturing steps is not taken into consideration, the crushed layer 30a formed on the rear surface 10b of the wafer 10 may be removed before the dividing step. If the crushed layer 30a is to be removed before the dividing step, the supporting member 15 can be once peeled off to, for example, newly fix a supporting member to the rear surface 10b side of the wafer 10. In that case, in the dividing step, a blade 27 can be run from the front surface 10a side of the wafer 10. However, if the thickness of the wafer 10 is reduced to 50 µm or less like the present embodiment, it is preferable to carry out the dividing step without peeling off the supporting member 15 from the viewpoint of improving the handling ability. Details of the crushed-layer removing step will be described later.

<Dividing Step>

Figure 14:
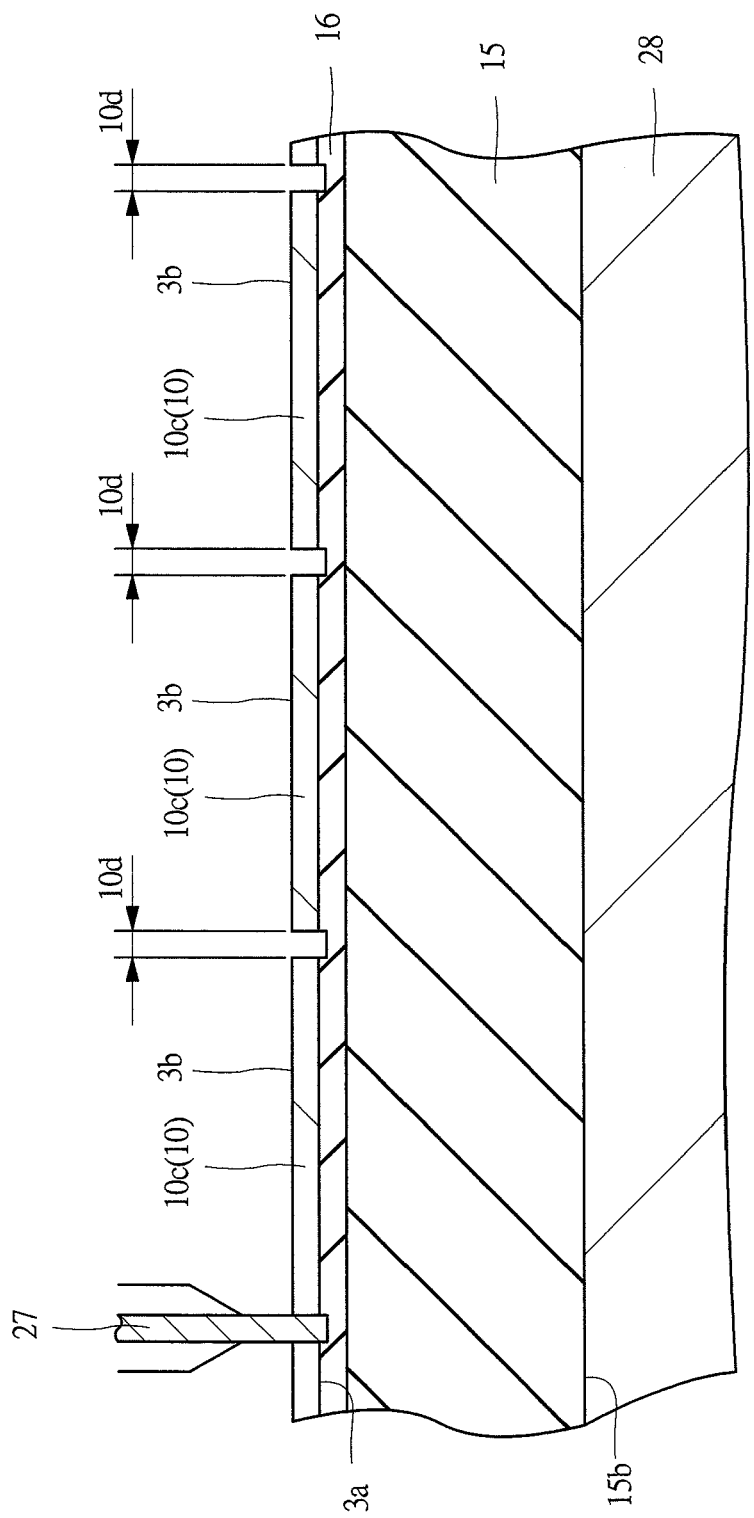
FIG. 14 is an enlarged cross-sectional view illustrating a dividing step illustrated in FIG. 5.
Figure 15:
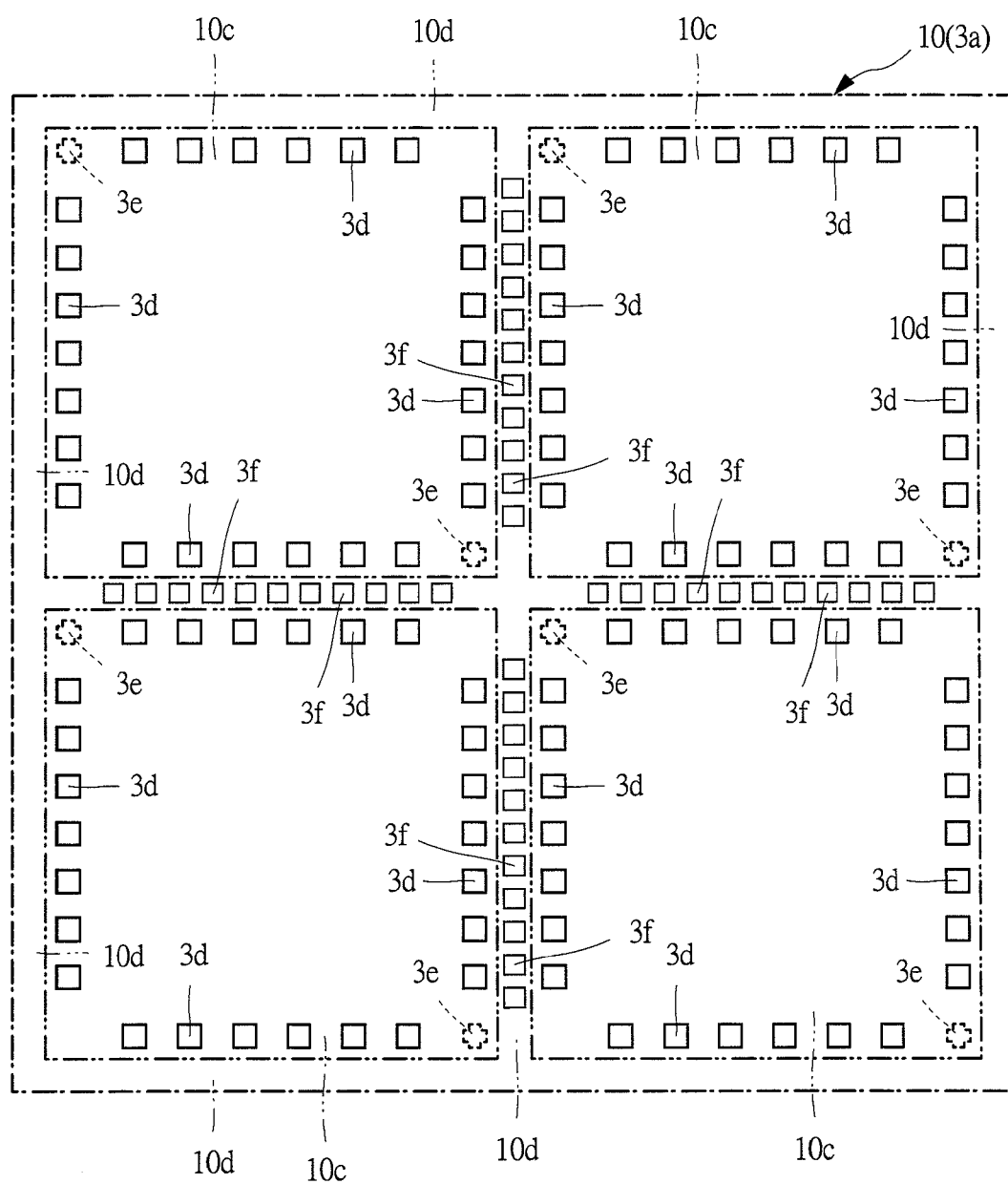
FIG. 15 is an enlarged plan view illustrating a front surface side of part of the wafer illustrated in FIG. 6 in an enlarged manner.

Then, in the dividing step, as illustrated in FIG. 14, when the blade 27 is run along the dicing regions 10d of the wafer 10 in the state in which the wafer 10 is fixed to the supporting member 15, the wafer 10 is divided per chip regions 10c. FIG. 14 is an enlarged cross-sectional view illustrating the dividing step illustrated in FIG. 5. FIG. 15 is an enlarged plan view illustrating the front surface side of part of the wafer illustrated in FIG. 6 in an enlarged manner.

In the present step, as illustrated in FIG. 14, the blade (dicing blade, rotating blade) 27 is run along the dicing regions 10d from the rear surface 3b side of the wafer 10, thereby cutting the wafer 10 and dividing the wafer 10 per the chip regions 10c. The blade 27 is a cutting jig (rotating blade) in which a plurality of abrasive grains composed of, for example, diamonds are fixed to the outer periphery of a thin plate forming a substantially circular outer shape. When the thin plate is rotated, the abrasive grains fixed to the outer periphery subjects a cutting object to cutting processing so as to cut it. A shape of a distal end part (side surface positioned in the outer peripheral part of the thin plate) of the blade 27 is a flat shape (straight shape), which is preferable from the viewpoint of durability of the blade 27.

In the present step, after the wafer 10 (the wafer 10 fixed to the supporting member 15) is fixed (fixed by suction) to a holding jig 28 serving as a working stage of a dividing device (dicing device), cutting processing by the blade 27 is carried out. FIG. 14 illustrates an aspect in which the rear-surface grinding step is carried out while the supporting member 15 is directly retained by suction by the holding jig 28; however, an adhesive tape (fixing tape, dicing tape), which is not illustrated, can be pasted to the surface 15b side of the supporting member 15 so as to fix the supporting member 15 via the adhesive tape. Moreover, in the present step, alignment for precisely disposing the blade 27 at the position of the dicing region 10d is carried out before cutting processing. In the present embodiment, the alignment is carried out in the state in which the front surface 3a side is covered with the bonding material 16; therefore, alignment marks 3e (see FIG. 6) for finding out the position of the wafer 10 cannot be visually checked. Therefore, the alignment marks 3e are recognized by using, for example, an infrared camera capable of recognizing the positions of the alignment marks 3e from the rear surface 3b side so as to carry out alignment. When the alignment is carried out by the method using an infrared camera in this manner, the alignment marks 3e are not required to be exposed from the front surface 3a of the wafer 10. Therefore, the alignment marks 3e of the present embodiment are covered with the insulating layer 13 (see FIG. 7). Upon formation of, for example, the pads 3d and the surface wiring (wiring 12c of the uppermost surface layer) illustrated in FIG. 7, the alignment marks 3e can be collectively formed by the same materials thereof. FIG. 6 illustrates the example in which the plurality of alignment marks 3e are disposed in the chip region 10c; however, the marks are not limited to that as long as the position and direction of the wafer 10 can be recognized, and, for example, they can be disposed in the dicing regions 10d.

As a method of dividing the wafer 10 using the blade 27, there is a method (full dicing method) in which the blade 27 is run only one time along the dicing region 10d so as to cut the wafer 10 in the thickness direction and a method (step dicing method) in which the wafer 10 is cut by a plurality of (for example, two) times by using the blades 27 of a plurality of types (for example, two types) having different widths. In the step dicing method, first, the semiconductor wafer is cut until an intermediate part of the semiconductor wafer by the blade 27 having a first width (first step). Then, the remaining part left in the first step is cut by using the blade 27 having a second width that is narrower than the first width so as to divide the wafer into the plurality of chip regions 10c. If the thickness of the wafer 10 is ground to 50 µm or less like the present embodiment, the thickness of the wafer 10 to be cut is too thin; therefore, the wafer 10 is divided in the first step. In other words, it is difficult to carry out the first step without dividing the wafer 10. Therefore, when the thickness of the wafer 10 is to be reduced to less than 50 µm, the full dicing method is used. However, when the thickness of the wafer 10 is to be increased to more than 50 µm as a modification example, the step dicing method can be also used. From the viewpoint of the durability (wear resistance) of the blade 27, it is preferable to widen (thicken) the width of the blade 27; however, from the viewpoint of suppressing chipping of the wafer 10 upon the cutting processing, it is preferable to narrow (reduce) the width of the blade 27. In the step dicing method, when dicing is gradually carried out by the plurality of blades 27 having different widths, durability of the blades 27 can be suppressed, and chipping of the wafer 10 can be suppressed.

Figure 16:
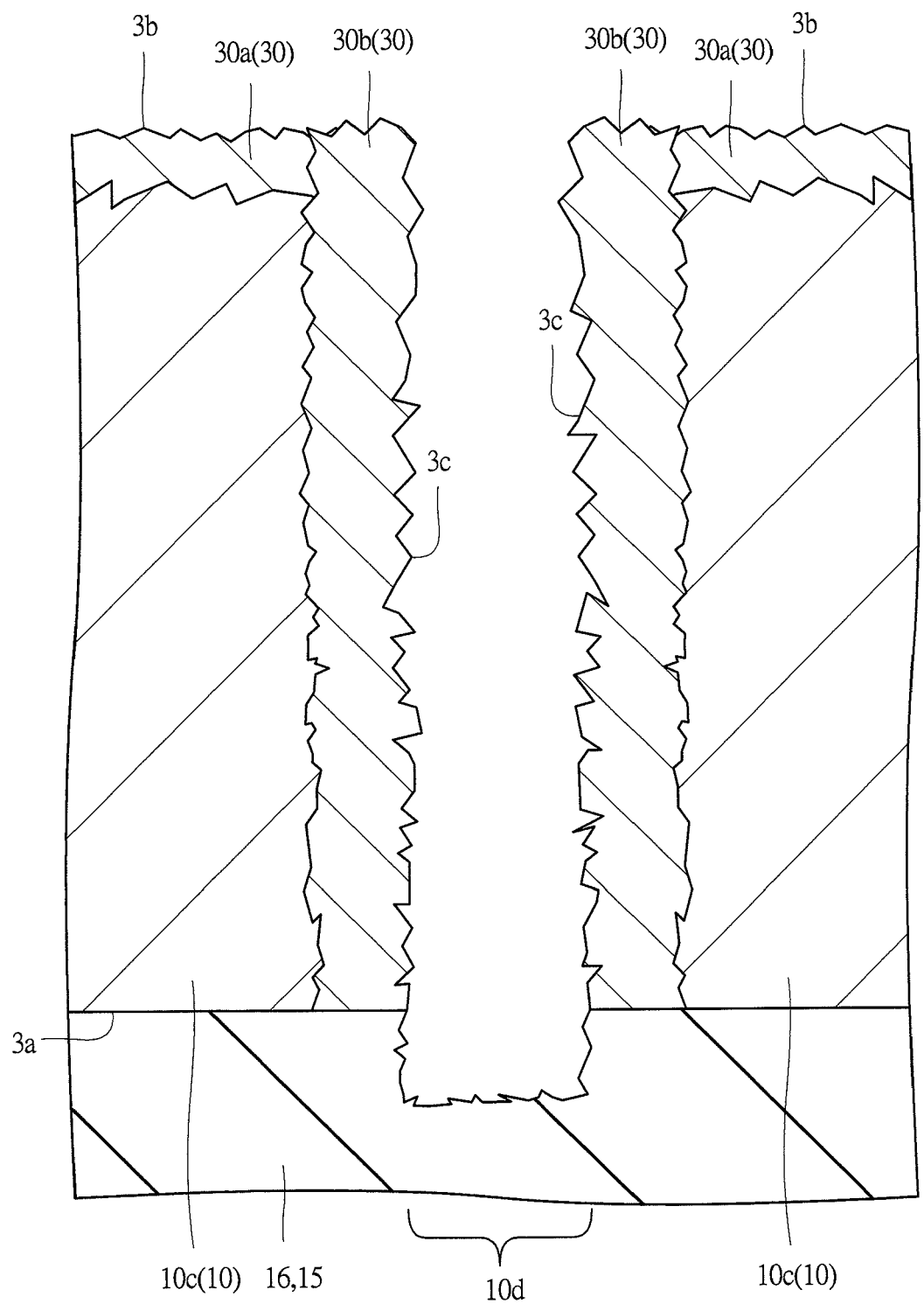
FIG. 16 is an enlarged cross-sectional view illustrating a state of side surfaces of chip regions after the dividing step illustrated in FIG. 14.

Herein, in the present step, the dicing region 10d of the wafer 10 is subjected to grinding processing by the blade 27, in which abrasive grains such as diamonds are fixed to the outer periphery of the thin plate; therefore, as illustrated in FIG. 16, a crushed layer (side-surface-side crushed layer) 30b caused by the cutting process of the dividing step is formed in the cut surfaces (the side surfaces 3c of the chip regions 10c), which are formed when the blade 27 is run. FIG. 16 is an enlarged cross-sectional view illustrating the state of the side surfaces of the chip regions after the dividing step illustrated in FIG. 14. The crushed layer 30b is a layer in which fine fractures (cracks) are formed upon the dividing step, and the crushed layer is formed, for example, on the entire side surface 3c, which has undergone the cutting process by the blade 27 (see FIG. 14), by a thickness of about 500 nm to 1 µm. The crushed layer 30b is formed by external force (shock or pressing force) applied to the dicing region 10d of the wafer 10 upon the cutting processing.

Particularly, as illustrated in FIG. 15, a plurality of metal patterns 3f are disposed in the dicing region 10d of the wafer 10. These metal patterns 3f are test elements called TEG (Test Element Group) and are formed so as to test whether formation is correctly carried out in a case in which an integrated circuit composed of a plurality of semiconductor elements or wiring layers is formed on the wafer 10. The metal patterns 3f are not limited to TEG, but are alignment marks in some cases, and only one pattern is disposed in one dicing region in some cases. For example, in the case in which the semiconductor substrate 11 (see FIG. 7) composed of silicon and the metal patterns 3f are collectively subjected to cutting processing by the blade 27, the crushed layer 30b is easily formed since the cutting resistance is different between the semiconductor substrate and the metal patterns 3f. If grinding dust is stuck between the plurality of abrasive grains fixed to the blade 27 (see FIG. 14), the cutting ability thereof is reduced; therefore, the crushed layer 30b is easily formed.

Another factor of formation of the crushed layer 30b is a case in which the wafer 10 is cut by the full dicing method. Specifically, the reason therefor is that, in the case of the full dicing method, the area the blade 27 is brought into contact with the wafer 10 in one dividing step is larger than that of the step dicing method. As a result, the external force (shock or pressing force) applied to the dicing region 10d of the wafer 10 is also increased; therefore, the crushed layer 30b is more easily formed than the case in which the step dicing method is applied.

In this manner, if it is made into a product in the state in which the crushed layers 30b formed on the side surfaces 3c of the chip regions 10c are remaining on the side surfaces 3c of the semiconductor chip 3 (see FIG. 4) as well as the crushed layer 30a described in the above-described rear-surface grinding step, the fractures expand from the crushed layers 30b and serve as a cause of damage on the semiconductor chip 3. According to the study made by the inventors of the present application, for example even in the case in which the crushed layer 30a is completely removed, if the crushed layer 30b is remaining, the strength of the semiconductor chip 3 is reduced. In other words, the bending strength or the shock resistance strength of the semiconductor chip 3 and the semiconductor device 1 (see FIG. 4) on which the chip is mounted is reduced. Therefore, in the present embodiment, the crushed-layer removing step illustrated in FIG. 5 is carried out after the dividing step so as to remove the crushed layers 30 composed of the crushed layers 30a and the crushed layers 30b before mounting the semiconductor chip 3, thereby preventing or suppressing reduction in the strength of the semiconductor device 1.

<Crushed-Layer Removing Step>

Figure 17:
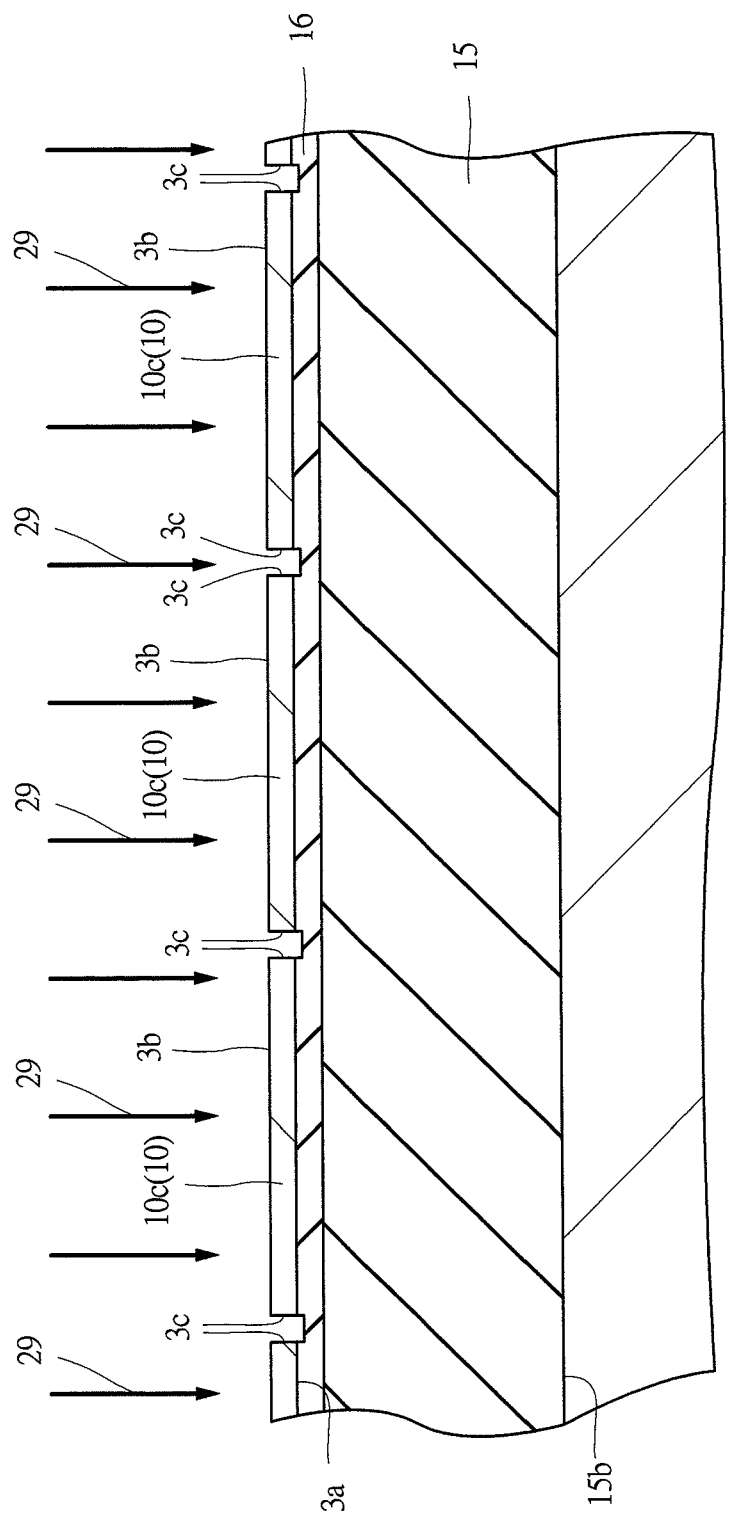
FIG. 17 is an enlarged cross-sectional view illustrating a crushed-layer removing step illustrated in FIG. 5.
Figure 18:
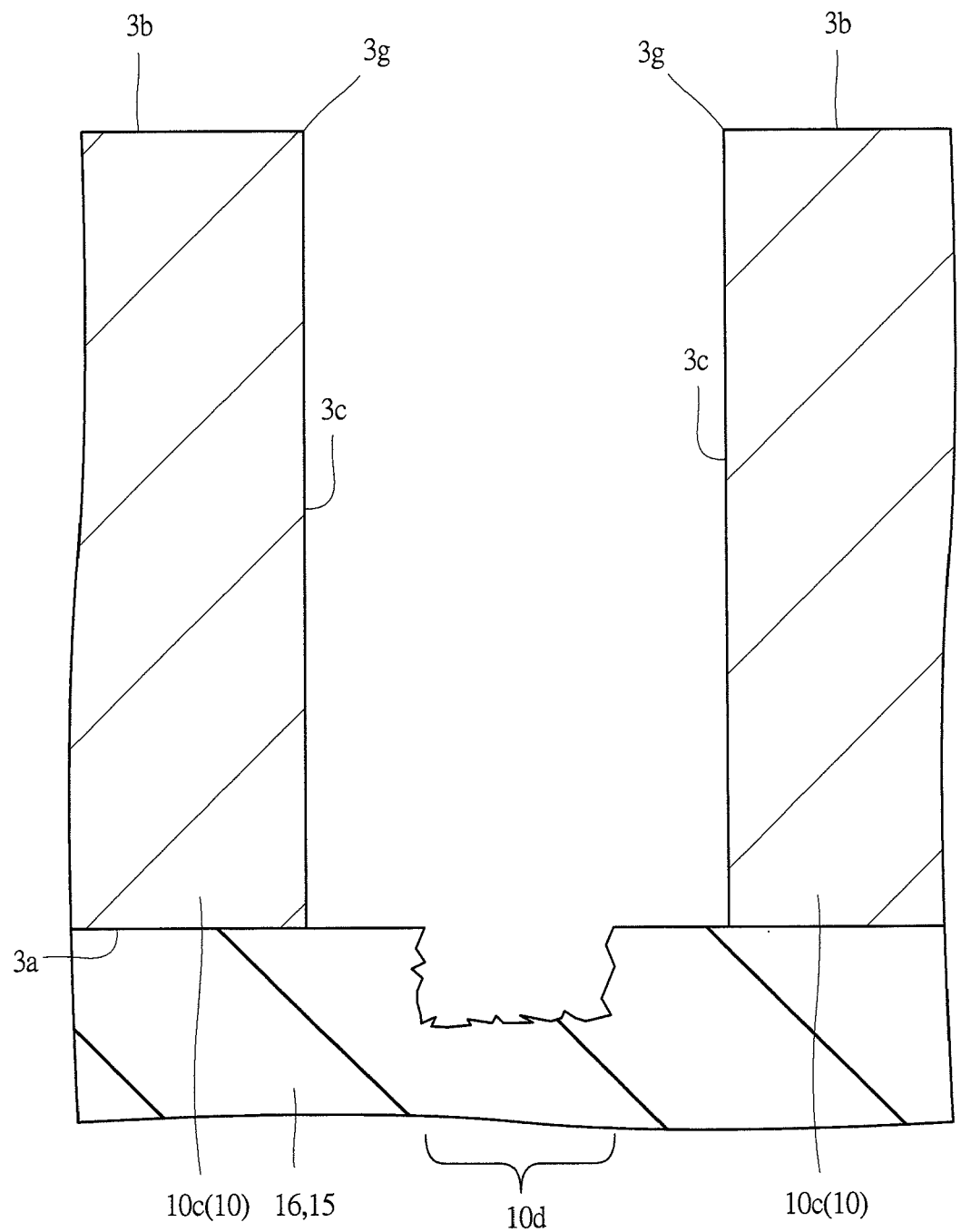
FIG. 18 is an enlarged cross-sectional view illustrating a state after the wafer illustrated in FIG. 16 is subjected to etching treatment.

Then, in the crushed-layer removing step, as illustrated in FIG. 17, the wafer 10 is subjected to etching from the rear surface 3b side so as to remove the crushed layers 30 illustrated in FIG. 16. FIG. 17 is an enlarged cross-sectional view illustrating the crushed-layer removing step illustrated in FIG. 5, and FIG. 18 is an enlarged cross-sectional view illustrating the state after the wafer illustrated in FIG. 16 is subjected to etching treatment. FIG. 17 illustrates the state in which an etching material is supplied from the rear surface 3b side of the wafer 10 toward the rear surfaces 3b and the side surfaces 3c of the chip regions 10c, and the etching material is a so-called etching gas used in plasma etching or etching liquid used in wet etching.

In the present step, as illustrated in FIG. 17, the etching material is supplied from the rear surface 3b side of the wafer 10 toward the rear surfaces 3b and the side surfaces 3c of the chip regions 10c, thereby carrying out etching. In the present step, the crushed layers 30 of the rear surfaces 3b and the side surfaces 3c of the chip regions 10c are exposed as illustrated in FIG. 16; therefore, when etching is carried out, the crushed layers 30 (see FIG. 16) of the rear surfaces 3b and the side surfaces 3c of the chip regions 10c are removed as illustrated in FIG. 18. In this process, if the crushed layers 30 formed on the rear surface (rear surface 3b of the chip region 10c) of the wafer 10 are removed before the dividing step, only the crushed layers 30 formed on the side surfaces 3c of the chip regions 10c are removed in the present step. Only the crushed layers 30 are required to be removed; therefore, the etching method may use a plasma etching method (dry etching method) in which the etching material being plasmanized is radiated to the wafer 10 in a gas phase or a wet etching method in which the etching material is supplied to the wafer 10 in a liquid phase. Regarding the degree of removing the crushed layers 30, in other words, the thickness of the region removed by etching (removal region), as illustrated in FIG. 18, it is particularly preferable to completely remove the crushed layers 30 (see FIG. 16). However, even if the crushed layers 30 are not completely removed, the particularly large irregular region on the surfaces of the crushed layers 30 can be removed when the etching is carried out; therefore, the strength of the semiconductor chip 3 (see FIG. 4) can be improved compared with the case in which etching treatment is not carried out.

According to the study made by the inventors of the present application, regarding the thicknesses of the crushed layers 30 illustrated in FIG. 16, the thickness of the crushed layer 30b on the side surface 3c side tends to be thicker than the thickness of the crushed layer 30a on the rear surface 3b side in the case in which the metal patterns 3f are formed in the dicing region as described above and the full dicing method is applied, where the thickness of the crushed layer 30b is about 1 to 2 μm. In this process, removal is carried out only by a thickness thicker than the thickness of the formed crushed layer 30b so that the crushed layer 30b can be completely removed. In the present embodiment, it is particularly preferable to carry out etching under the conditions in which the rear surfaces 3b and the side surfaces 3c are removed by about 3 μm to 5 μm from the exposed surface. On the other hand, the thickness of the region removed by etching (removal region) is correlated to the etching time and etching rate; therefore, if the thickness of the removal region is to be increased, reliability of the semiconductor chip 3 (see FIG. 4) may be reduced; therefore, it is preferable to carry out etching within the range capable of suppressing that.

For example, in the case in which a mixed gas of an additive gas such as an oxygen gas or fluorine gas is used in addition to a sulfur hexafluoride ($SF_6$) gas is used as the etching material (etching gas) 29 in the plasma etching method, etching treatment progresses at an etching rate of about 1 μm per a minute. Therefore, it is preferable that the etching time is three minutes or more. However, if plasma is radiated for a long period of time, the temperature of the chip region 10c may increase and affects characteristics of the semiconductor chip 3. Therefore, it is preferable that the radiation time of the plasma is 10 minutes or less, in other words, the thickness of the removal region is preferably 10 μm or less. When the inventors of the present application carried out etching under the above-described conditions, even when plasma was radiated for, for example, 10 minutes, a visible round processing part (arced or tapered chamfered processing part) was not confirmed at a corner part (edge part) 3g on the rear surface 3b side of the chip region 10c illustrated in FIG. 18. When confirmed by an electron microscope, even a large radius of the chamfered processing part (curvature radius of the case in which the chamfered processing part is considered to be an arc) was less than 50 μm.

For example, if hydrofluoric-nitric acid (mixed liquid of hydrofluoric acid and nitric acid) is used as the etching material (etching liquid) 29 in the wet etching method, the etching rate is about 0.55 μm per second which is higher than that in the plasma etching method. When the etching rate is high in this manner, it is preferred that the thickness of the removal region is thicker than that of the plasma etching method, for example, about 20 μm to flatten the side surface 3c after etching. However, if the etching time is long, a possibility that the etching liquid may enter from a gap (for example, the interface between the wafer 10 and the bonding material 16 or the interface between the wiring layers 12 illustrated in FIG. 7) of the wafer 10 increases. Therefore, it is preferred that the etching time is about 30 seconds to 40 seconds.

<Semiconductor Chip Obtaining Step>

Then, in the crushed-layer removing step, after the supporting-member peeling step of peeling off the supporting member 15 from the wafer 10 is carried out in the manner illustrated in FIG. 10, the chip regions 10c are individually taken out from the fixing tape (adhesive tape) 22 illustrated in FIG. 10 so as to obtain a plurality of semiconductor chips 3 illustrated in FIGS. 3 and 4. Since the supporting-member peeling step has been already described, repetitive explanation will be omitted. In the step of individually taken out the chip regions 10c from the fixing tape (adhesive tape) 22, applied general techniques of taking out diced semiconductor chips from a dicing tape can be used. For example, an ultraviolet curable resin component before curing is caused to be contained in the adhesive material of the fixing tape 22 in advance. Then, when the fixing tape 22 is irradiated with ultraviolet rays so as to harden the adhesive material after the bonding material 16 is peeled off from the front surface 3a side of the chip regions 10c in the manner illustrated in FIG. 10, the bonding strength of the fixing tape 22 is lowered. If the bonding strength of the fixing tape 22 is lowered, the individual chip regions 10c (the semiconductor chips 3 illustrated in FIGS. 3 and 4) can be easily taken out by using, for example, a holding jig (pickup jig) called collet (illustration omitted). Incidentally, in the present step, the extremely-thin semiconductor chip 3 having a thickness of 50 μm or less is taken out in the state in which it is not supported by the supporting member 15 (see FIG. 10). However, in the semiconductor chip 3 diced in the above-described dividing step, the planar area of the front surface 3a and the rear surface 3b is smaller than that of the integrated wafer 10 (for example, see FIG. 12); therefore, deformation or damage upon handling does not easily occur.

Through the above-described steps, the semiconductor chips 3 illustrated in FIGS. 3 and 4 are obtained. In other words, the semiconductor chip preparing step illustrated in FIG. 5 is finished.

<Semiconductor-Device Assembling Step>

Next, a step of assembling the semiconductor device 1 illustrated in FIGS. 1 to 4 will be simply described in accordance with FIG. 5.

Figure 19:
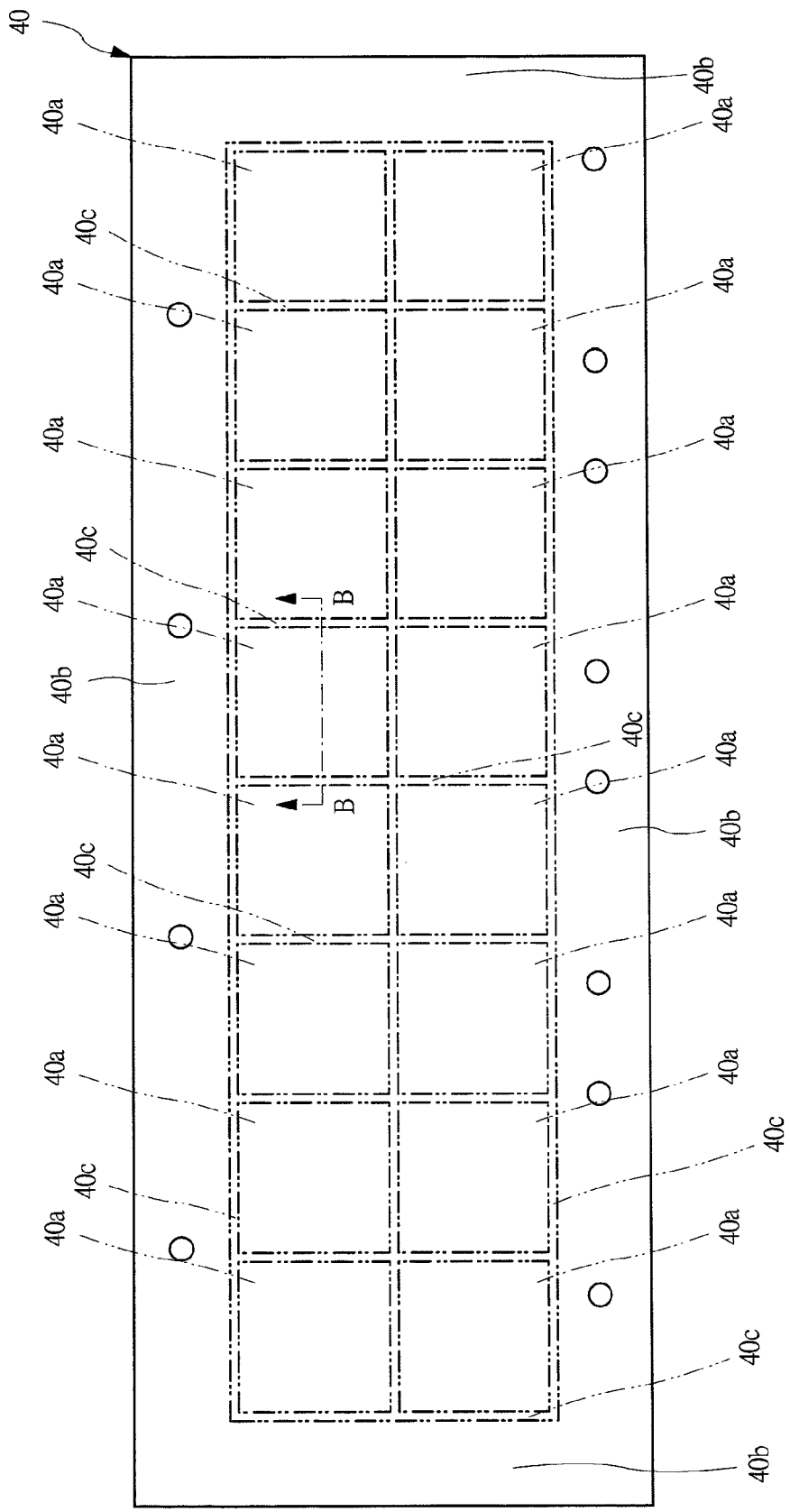
FIG. 19 is a plan view illustrating an overall structure of a wiring board prepared in a substrate preparing step illustrated in FIG. 5.
Figure 20:
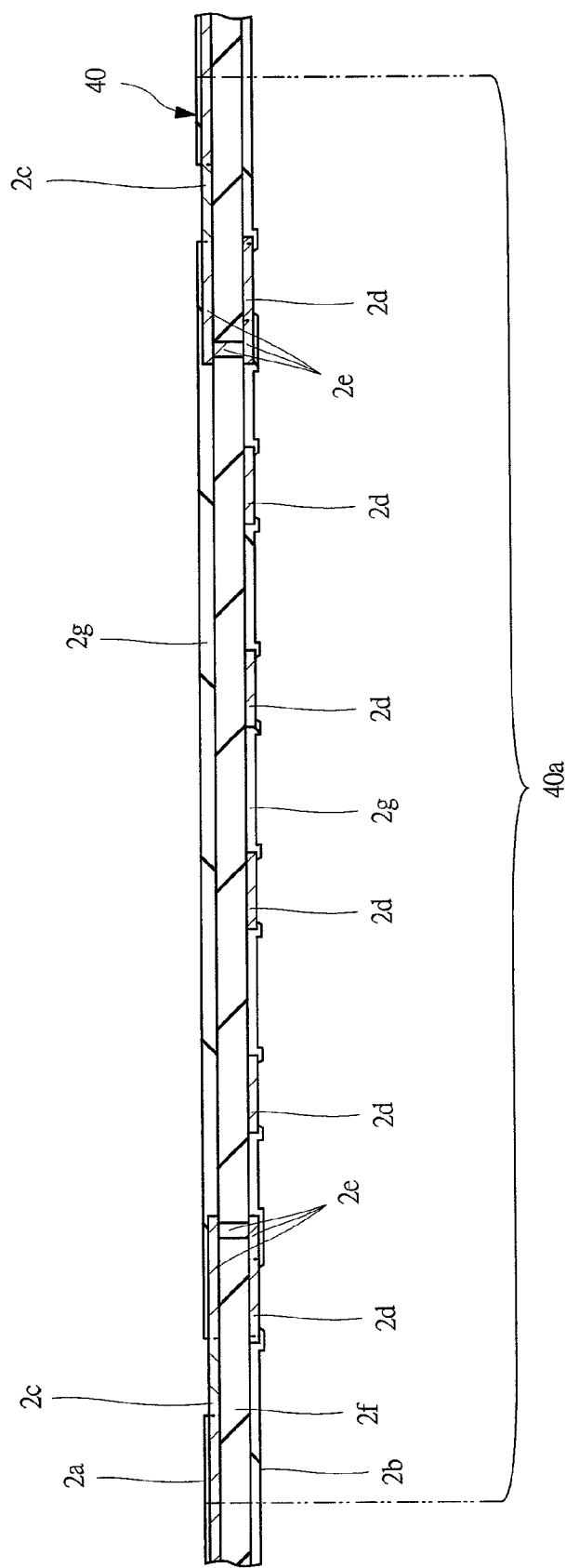
FIG. 20 is an enlarged cross-sectional view taken along the line B-B of FIG. 19.

First, as a substrate preparing step illustrated in FIG. 5, a wiring board 40 as illustrated in FIG. 19 is prepared. FIG. 19 is a plan view illustrating the overall structure of the wiring board prepared in the substrate preparing step illustrated in FIG. 5, and FIG. 20 is an enlarged cross-sectional view taken along the line B-B of FIG. 19. As illustrated in FIG. 19, the wiring board (substrate) 40 prepared in the present step is provided with a plurality of device regions 40a in a frame part (frame body) 40b. The wiring board 40 is what we call a multi-device substrate having the plurality of device regions 40a, and each device region 40a corresponds to the wiring board 2 described by using FIGS. 1 to 4. Dicing regions 40c are disposed between the mutually adjacent device regions 40a. The wiring board 40 has an upper surface (chip mounting surface, front surface) 2a and a lower surface (packaging surface, rear surface) 2b opposite to the upper surface 2a, in which members constituting the above-described wiring board 2 are formed in advance. In the present embodiment, a method of manufacturing the semiconductor device provided with the wiring board 40 will be described; however, the substrate is not limited to that. For example, as a modification example, the wiring board 40 illustrated in FIG. 19 can be replaced by a lead frame (substrate).

Figure 21:
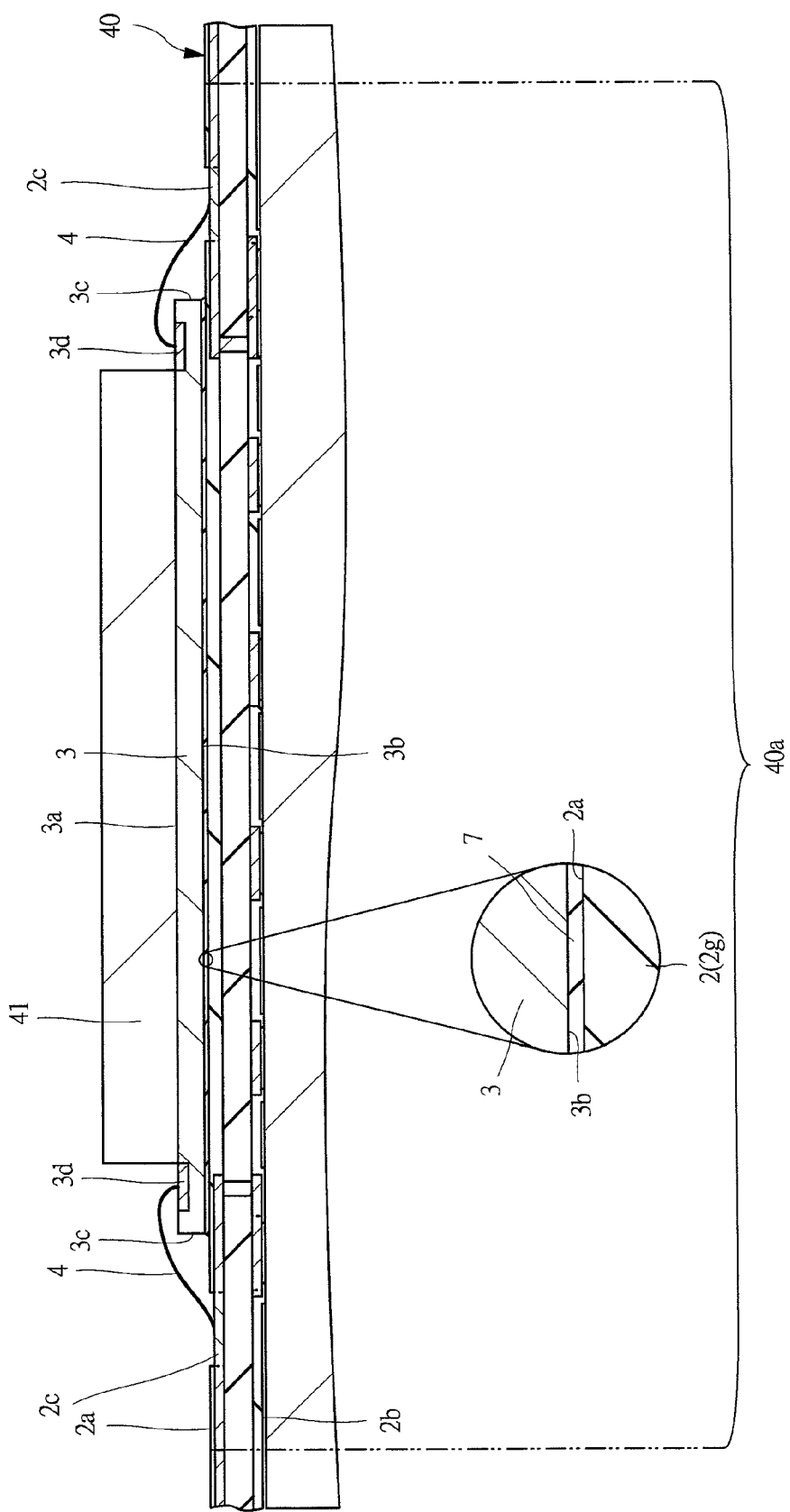
FIG. 21 is an enlarged cross-sectional view illustrating a state in which a semiconductor chip is mounted on the wiring board illustrated in FIG. 20.

Then, as a die bonding step, as illustrated in FIG. 21, the semiconductor chip 3 prepared in the above-described semiconductor chip preparing step is mounted on the wiring board 40. FIG. 21 is an enlarged cross-sectional view illustrating the state in which the semiconductor chip is mounted on the wiring board illustrated in FIG. 20. In the present step, as illustrated in FIG. 21, the semiconductor chip 3 is pressed against the wiring board 40 by a chip mounting jig 41 so as to mount the chip on the wiring board 40 via the bonding material 7. In this process, if the crushed layers 30b illustrated in FIG. 16 are remaining, the fractures (cracks) may expand due to the external force upon mounting; however, since the crushed layers 30b have been removed together with the crushed layers 30a according to the present embodiment, this can be prevented or suppressed.

Figure 22:
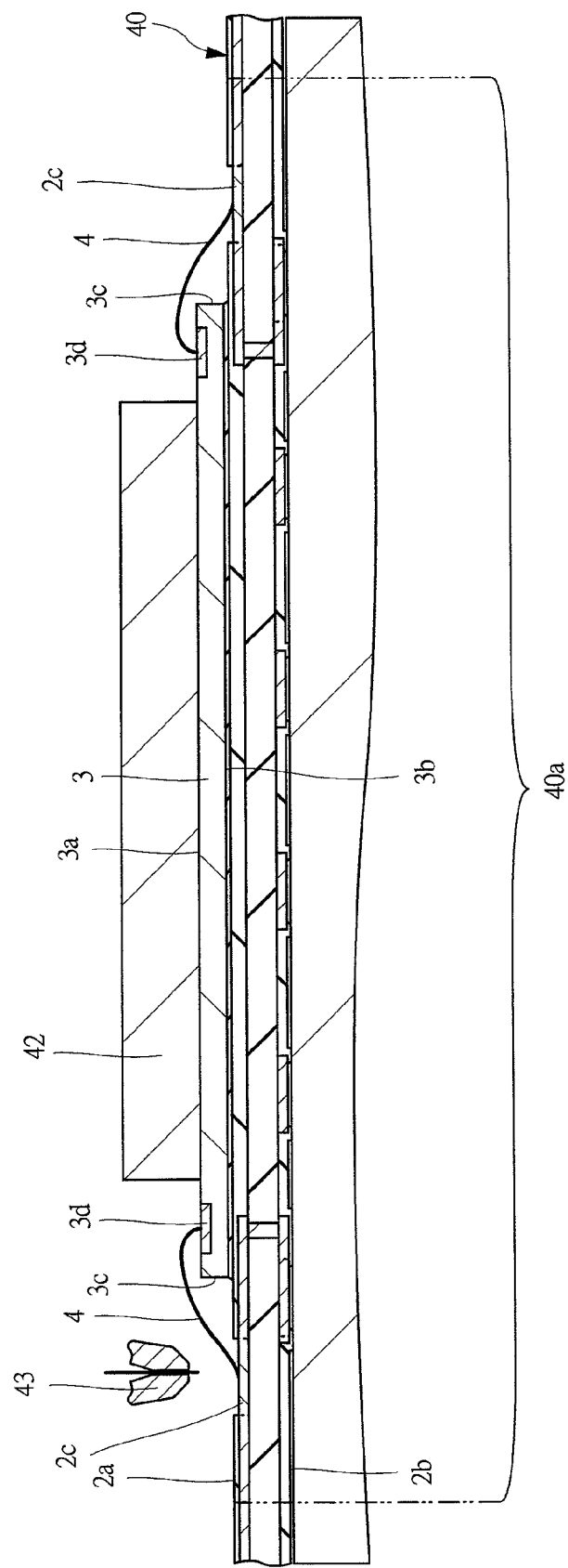
FIG. 22 is an enlarged cross-sectional view illustrating a state in which the semiconductor chip and the wiring board illustrated in FIG. 21 are electrically connected via a plurality of wires.

Then, as an electric connection step, as illustrated in FIG. 22, the pads 3d of the semiconductor chip 3 and the bonding leads 2c of the wiring board 40 are electrically connected to each other via the plurality of wires 4, which are electrically conductive members. FIG. 22 is an enlarged cross-sectional view illustrating the state in which the semiconductor chip and the wiring board illustrated in FIG. 21 are electrically connected to each other via the plurality of wires. In the present step, in the state in which the front surface 3a side of the semiconductor chip 3 is heated by a heater 42, the wire 4 is pressed against the pad 3d by a capillary 43 so as to join them. For example, a thermocompression bonding method, an ultrasonic method, or a combination method using them in combination, can be applied as the joining method of the wire 4 and the pad 3d; and, in the present embodiment, the combination method is employed. External force is applied to the semiconductor chip 3 also when an end of the wire 4 is pressed against the pad 3d; however, in the present embodiment, since the crushed layers 30b have been removed together with the crushed layers 30a illustrated in FIG. 16, expansion of fractures (cracks) upon wire bonding can be prevented or suppressed. In the present embodiment, as illustrated in FIG. 14, the present embodiment describes an aspect in which mounting is carried out by the face-up packaging method, wherein the rear surface 3b of the semiconductor chip 3 is opposed to the upper surface 2a of the wiring board 40. In the case in which the mounting is carried out by a face-down packaging method in which the front surface 3a of the semiconductor chip 3 is mounted so as to be opposed to the upper surface 2a of the wiring board 40 as a modification example, in the above-described die bonding step, they are electrically connected with the bonding leads 2c of the wiring board 40 via bump electrodes (electrically-conductive members) formed on the plurality of pads 3d.

Figure 23:
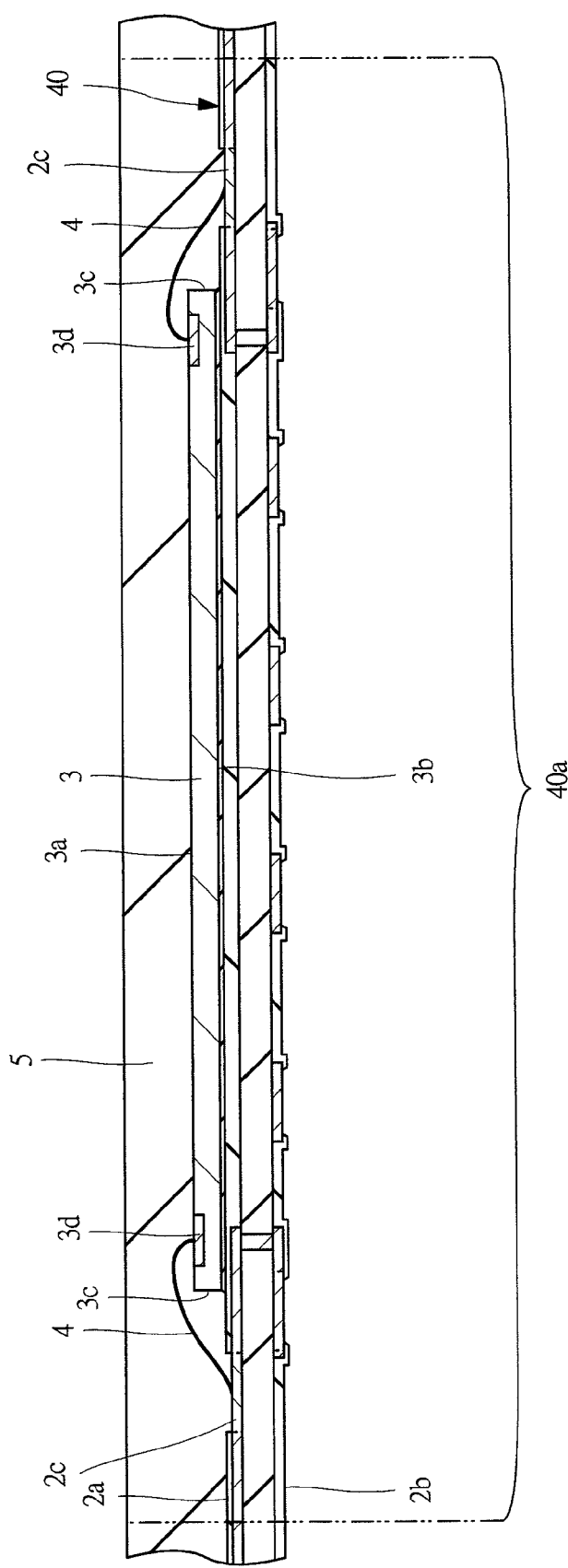
FIG. 23 is an enlarged cross-sectional view illustrating a state in which the semiconductor chip and the plurality of wires illustrated in FIG. 22 are sealed.

Then, as a sealing step, as illustrated in FIG. 23, the sealant 5 is formed so as to seal the semiconductor chip 3 and the plurality of wires 4 connected thereto. FIG. 23 is an enlarged cross-sectional view illustrating the state in which the semiconductor chip and the plurality of wires illustrated in FIG. 22 are sealed. FIG. 23 illustrates a mode in which the sealant 5 composed of a resin is formed so as to cover the upper surface 2a of the wiring board 40. Although omitted in FIG. 5, the plurality of solder balls (projecting electrodes) 6 (see FIG. 4) serving as joining materials for electrically connecting the semiconductor device 1 illustrated in FIG. 4 with external devices are joined with the plurality of lands 2d, respectively, as a ball mount step after the sealing step and before a dicing step, which will be described next.

Then, as the dicing step, the wiring board 40 is divided and diced into the device regions 40a illustrated in FIG. 19. Although illustration is omitted, for example, a method of cutting the wiring board 40 and the sealant 5 by using a dicing blade can be applied as the dividing method.

Then, as a testing and sorting step, a test such as an appearance test is carried out so as to classify good or bad of the product, thereby obtaining the semiconductor device 1 illustrated in FIGS. 1 to 4.

Modification Examples

Figure 24:
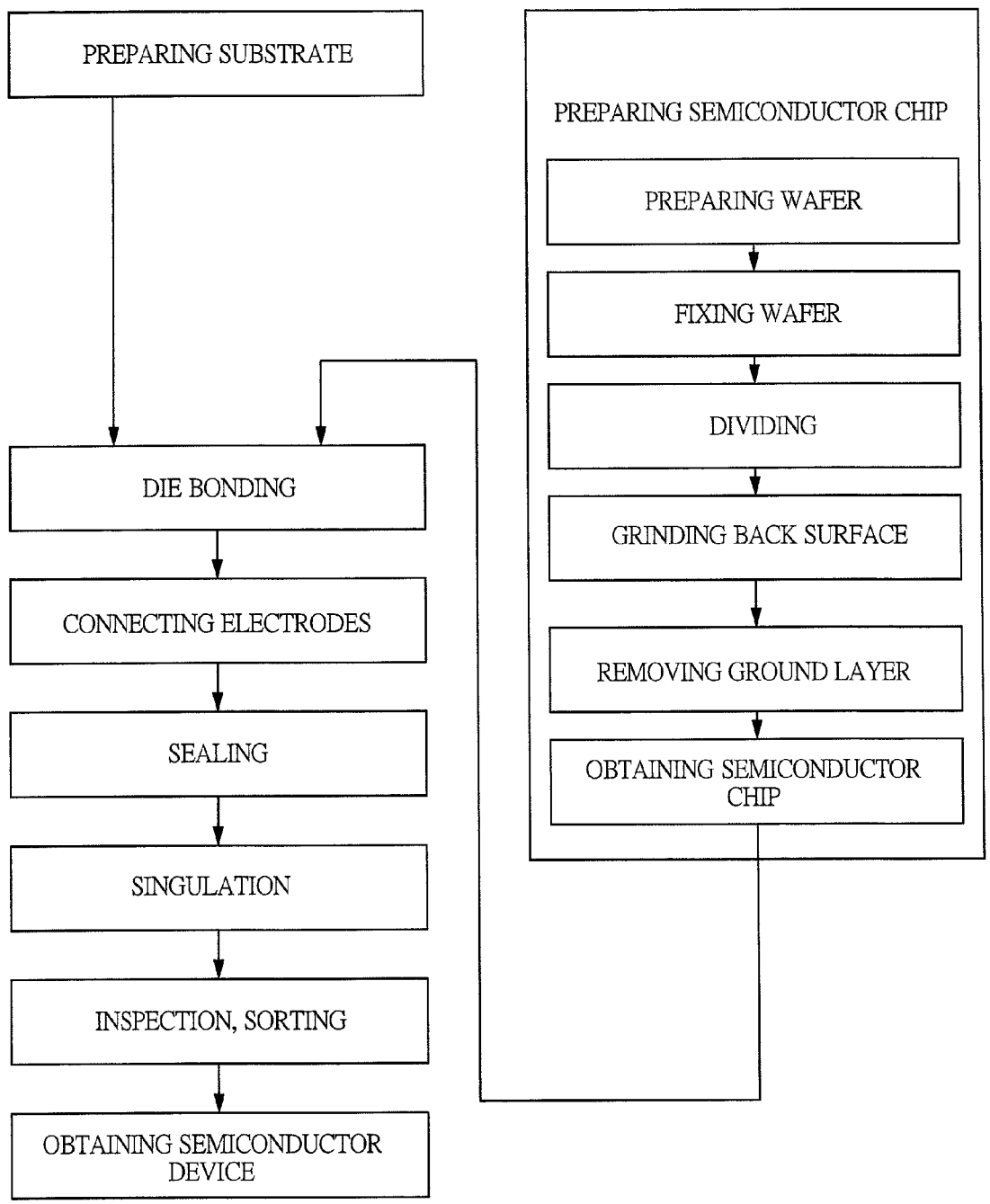
FIG. 24 is an explanatory diagram illustrating a modification example with respect to FIG. 5.
Figure 25:
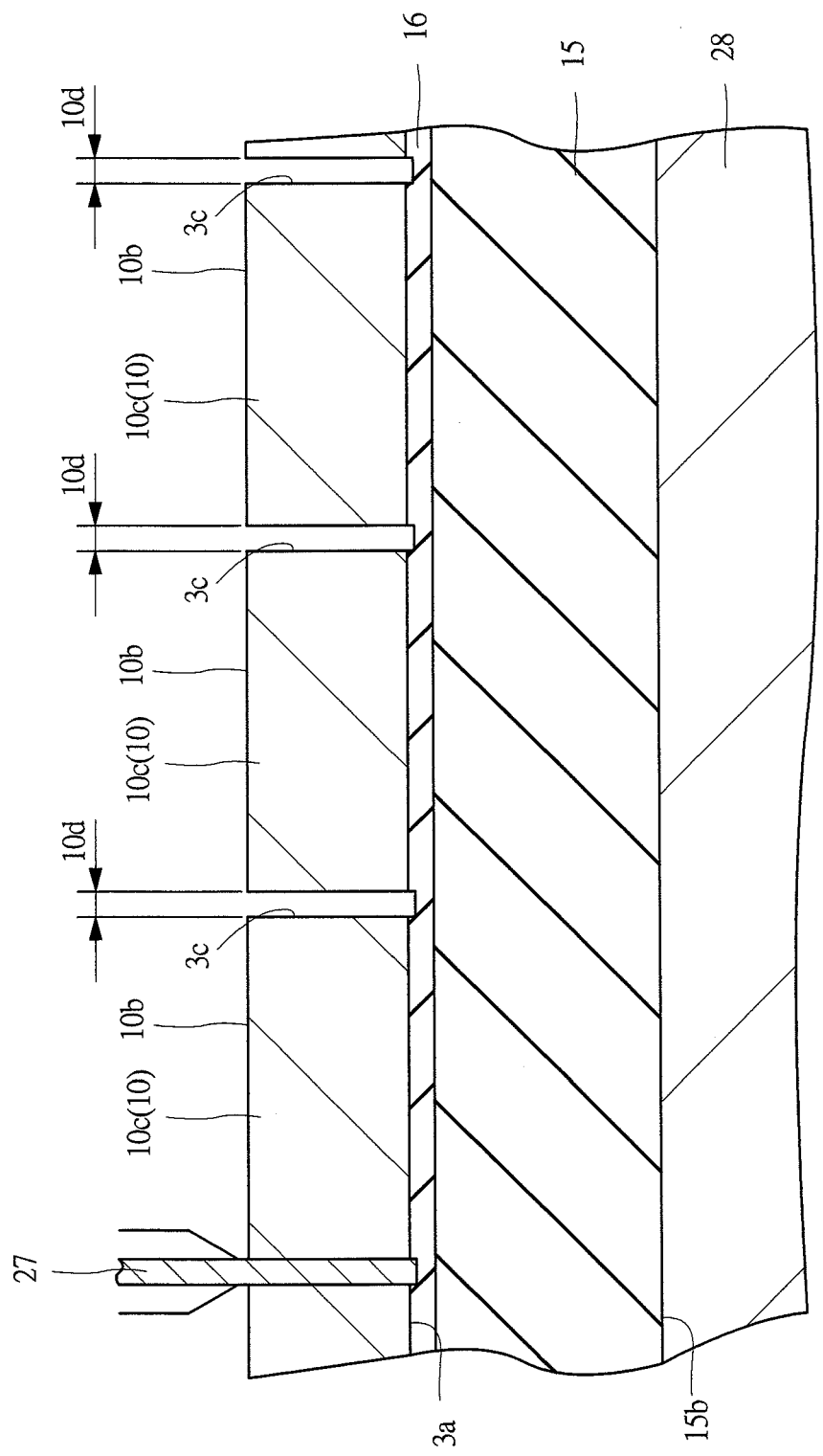
FIG. 25 is an enlarged cross-sectional view illustrating a modification example with respect to FIG. 14.

Then, modification examples of the mode described in the above-described embodiment will be described. First, a modification example of the order of the steps illustrated in FIG. 5 will be described. FIG. 24 is an explanatory diagram illustrating the modification example with respect to FIG. 5, and FIG. 25 is an enlarged cross-sectional view illustrating the modification example with respect to FIG. 14. In the example illustrated in FIG. 24, the dividing step described in the above-described embodiment is carried out before the rear-surface grinding step. The points other than that are similar to FIG. 5. More specifically, as illustrated in FIG. 25, before the rear surface 10b of the wafer 10 is ground, cutting processing by the blade 27 is carried out first so as to singulate the wafer into the chip regions 10c. Then, when the rear-surface grinding process is carried out in a manner similar to FIG. 11, the semiconductor chips 3 (see FIG. 4) can be obtained as well as the above-described embodiment. In the process flow illustrated in FIG. 24, the rear-surface grinding step is carried out after division; therefore, grinding fluid or grinding dust sometimes enter the gaps between the mutually adjacent chip regions 10c in the rear-surface grinding step. However, since the front surface 3a side of the wafer 10 has been brought into close contact with the hardened ultraviolet curable resin layer 16a (see FIG. 8) in the wafer fixing step, contamination in the front surface 3a side of the wafer 10 can be suppressed. However, if the rear-surface grinding process is carried out in the state in which the crushed layers 30b (see FIG. 16) are formed on the side surfaces 3c of the chip regions, the fractures of the crushed layers 30b may expand due to the external force upon the rear-surface grinding. Therefore, it is particularly preferable that the dividing step is carried out after the rear-surface grinding step as illustrated in FIG. 5. In the case in which the dividing step is carried out before the rear-surface grinding step as illustrated in FIG. 24, it is preferred that the crushed-layer removing step is once carried out before the rear-surface grinding step. More specifically, from the viewpoint of preventing or suppressing reduction in the strength of the semiconductor device, it is preferred that the step of removing the crushed layers 30b formed on the side surfaces 3c of the chip regions 10c and the step of removing the crushed layers 30a (see FIG. 16) formed on the rear surfaces 3b (drawing) is separately carried out. In other words, according to the step flow illustrated in FIG. 5, the crushed-layer removing step is required to be carried out once, and reduction in the strength of the semiconductor device can be prevented or suppressed.

Incidentally, as another modification example of the aspect in which the dividing step is carried out before the rear-surface grinding step, what we call a first dicing method of carrying out cutting processing by the blade 27 from the front surface 3a side of the wafer 10 to an intermediate part of the wafer 10 and then grinding the wafer 10 in the rear-surface grinding step until the thickness thereof becomes thinner than the position of the cutting processing is conceivable. In this first dicing method, the cutting processing by the blade 27 is carried out from the front surface 3a side of the wafer 10; therefore, the wafer fixing step is carried out after the dividing step and before the rear-surface grinding step so as to fix the wafer 10 to the supporting member 15. However, in this case, grinding is carried out in the state in which the grooves formed by the cutting processing of the blade 27 are being formed on the front surface 3a side of the wafer 10; therefore, if the wafer step illustrated in FIG. 9 is applied, part or all of the side surfaces 3c of the chip regions is fixed in a state of being covered with the bonding material 16. Therefore, in the first dicing method, a fixing method using an adhesive tape is used instead of the fixing method as illustrated in FIGS. 8 to 10.

Figure 26:
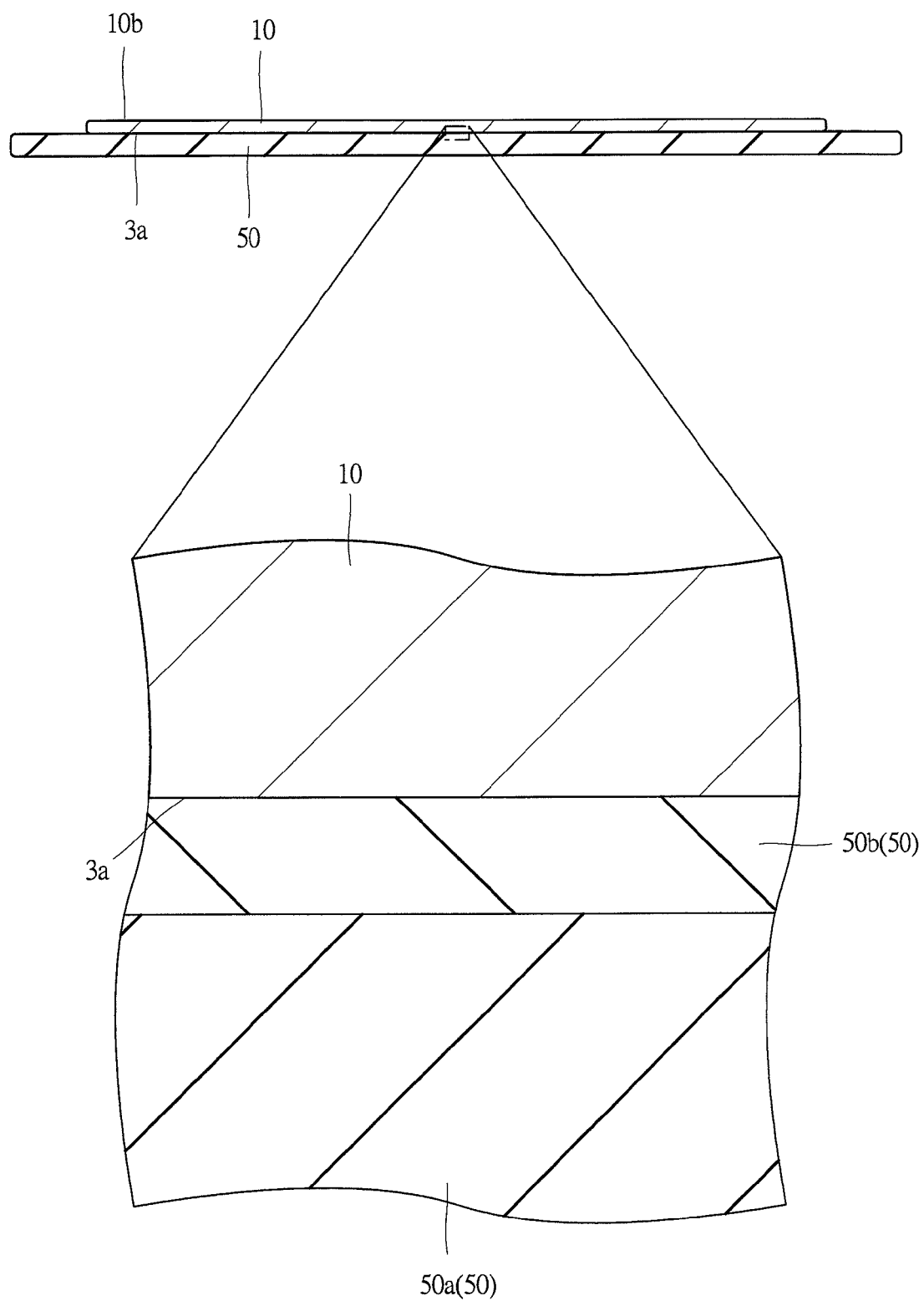
FIG. 26 is a cross-sectional view illustrating a modification example with respect to FIG. 8.

Next, as a modification example of the wafer fixing step, an example using an adhesive tape as a supporting member will be described. FIG. 26 is a cross-sectional view illustrating a modification example with respect to FIG. 8, and FIG. 27 is an enlarged cross-sectional view illustrating another modification example with respect to FIG. 14.

Figure 27:
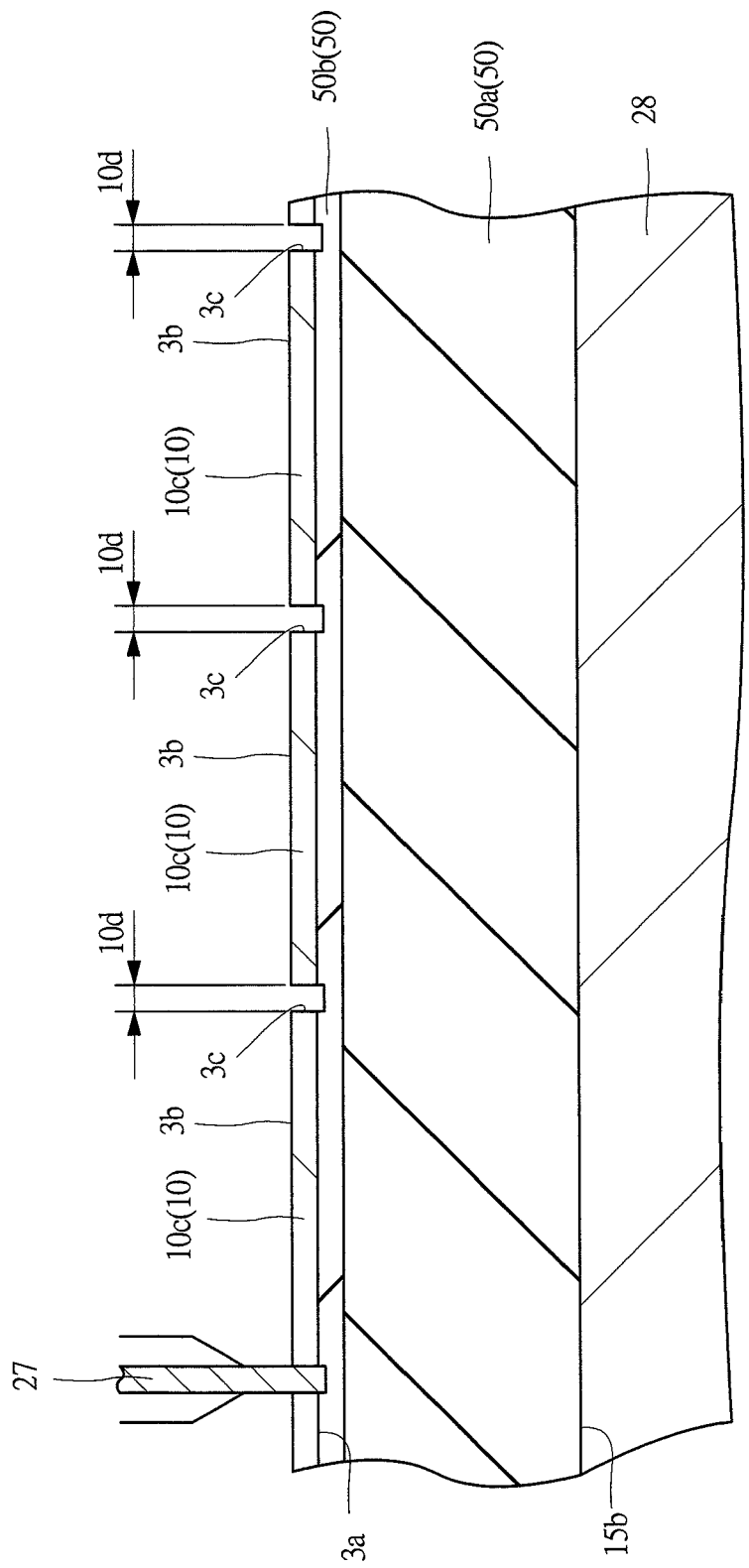
FIG. 27 is an enlarged cross-sectional view illustrating another modification example with respect to FIG. 14.

A point different between the example illustrated in FIGS. 8 and 14 and the modification example illustrated in FIGS. 26 and 27 is the point that the supporting member fixing the wafer 10 is an adhesive tape (back grind tape) 50 in which an adhesive material (sticking material) 50b is disposed on one of the surfaces (surface opposed to the wafer 10) of a resin film (base material) 50a. In the above-described rear-surface grinding step, if the wafer after the rear-surface grinding process is thicker than 50 μm and is, for example, about 100 μm, the rigidity of the wafer 10 after the rear-surface grinding process is strong; therefore, the adhesive tape 50 illustrated in FIG. 26 can be used as the supporting member. If the adhesive tape 50 is used as the supporting member, a material for manufacturing (adhesive tape 50) can be obtained at a lower cost than the case in which the supporting member 15 (see FIG. 8) composed of, for example, a glass plate is used. However, even if the thickness of the wafer 10 after the rear-surface grinding process is about 100 μm, warping deformation is generated in the wafer 10 in some cases; therefore, it is preferable to fix the wafer to the supporting member 15 (see FIG. 8) having a higher rigidity than the wafer 10 after the grinding process like the above-described embodiment. Therefore, also in the case in which the adhesive tape 50 is used, it is preferable that the thickness of the adhesive tape 50 is thicker than the thickness of the wafer 10 after the grinding process. Also from the viewpoint of close contact between the surface of the wafer 10 and the supporting member upon the rear-surface grinding step, it is preferable to fix the wafer 10 to the supporting member 15 by curing a liquid resin (ultraviolet curable resin 16c illustrated in FIG. 9) as illustrated in FIG. 8. In the case in which the adhesive tape 50 is used in wafer fixation, part of the adhesive tape 50 is subjected to cutting processing together with the wafer 10; therefore, the blade 27 illustrated in FIG. 27 sometimes involve the adhesive material 50b, making the adhesive material adhere to the side surfaces 3c of the chip regions 10c. If the amount of the adhesive material 50b adhered to the side surfaces 3c is large, the crushed layers 30b (see FIG. 16) to which the adhesive material 50b has adhered cannot be completely removed in some cases in the crushed-layer removing step. Therefore, from the viewpoint of reliable removal of the crushed layer 30b, the method of fixing the supporting member 15 via the bonding material 16 composed of the hardened resin as illustrated in FIGS. 8 to 10 is preferable.

When using the adhesive tape 50, to suppress the situation that the adhesive material 50b of the adhesive tape 50 pasted on the wafer 10 remains on the surface of the pad 3d of the wafer 10 even after the adhesive tape 50 is peeled off, it is preferable to improve the peeling ability of the adhesive material 50b. As a method of improving the peeling ability of the adhesive material 50b, for example, a method of mixing an ultraviolet curable resin component in the adhesive material 50b and radiating ultraviolet rays before peeling off the adhesive tape 50 to harden it can be used.

Figure 28:
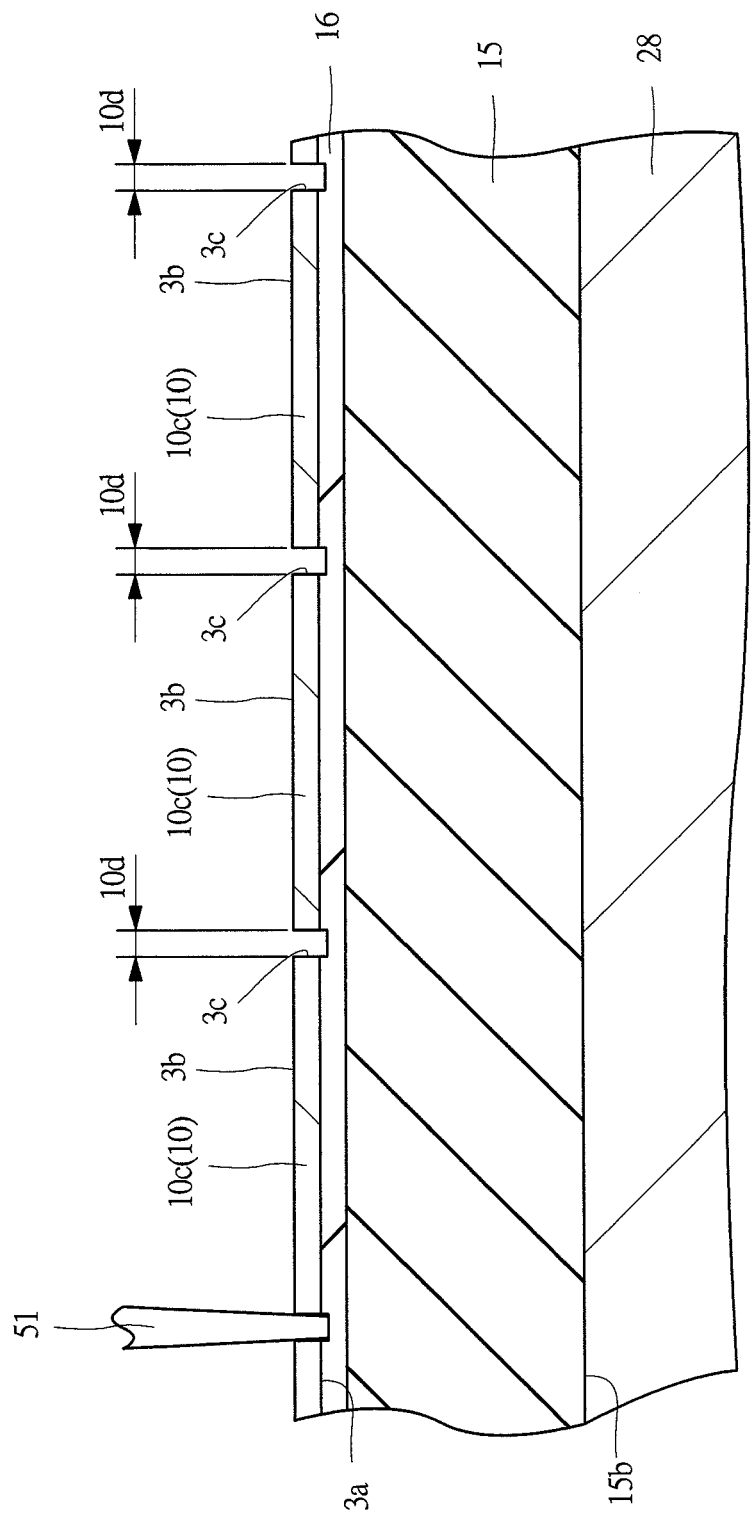
FIG. 28 is an enlarged cross-sectional view illustrating another modification example with respect to FIG. 14.

Next, as a modification example of the dividing step, an aspect of dividing the wafer 10 by irradiating the wafer 10 with laser will be described. FIG. 28 is an enlarged cross-sectional view illustrating another modification example with respect to FIG. 14. In the example illustrated in FIG. 28, in the state in which the wafer 10 is fixed to the supporting member 15 in the dividing step, the dicing regions 10d of the wafer 10 are irradiated with laser 51 from the rear surface 3b side, thereby dividing the wafer 10 per the chip regions 10c. More specifically, the dicing regions 10d of the wafer 10 are separated by melting by the energy of the laser 51. In this process, thermal energy caused upon the melt separation is applied to the peripheries of the dicing regions, and the crushed layers 30b (see FIG. 16) are formed on the side surfaces 3c of the chip regions 10c. When it is made into a product in a state in which the crushed layers 30b formed by the laser 51 are remaining on the side surfaces 3c of the semiconductor chip 3 (see FIG. 4), the fractures expand from the crushed layers 30b, and the crushed layers 30b also serve as a cause of damage on the semiconductor chip 3 as well as the crushed layers 30b (see FIG. 16) formed by the blade 27 illustrated in FIG. 14. Therefore, even in the case in which the laser dicing method of radiating the laser 51 is applied, reduction in the strength of the semiconductor chip 3 or the semiconductor device 1 illustrated in FIG. 4 can be prevented or suppressed by removing the crushed layers 30b illustrated in FIG. 16 in the crushed-layer removing step as illustrated in FIG. 5 or FIG. 24.

Figure 29:
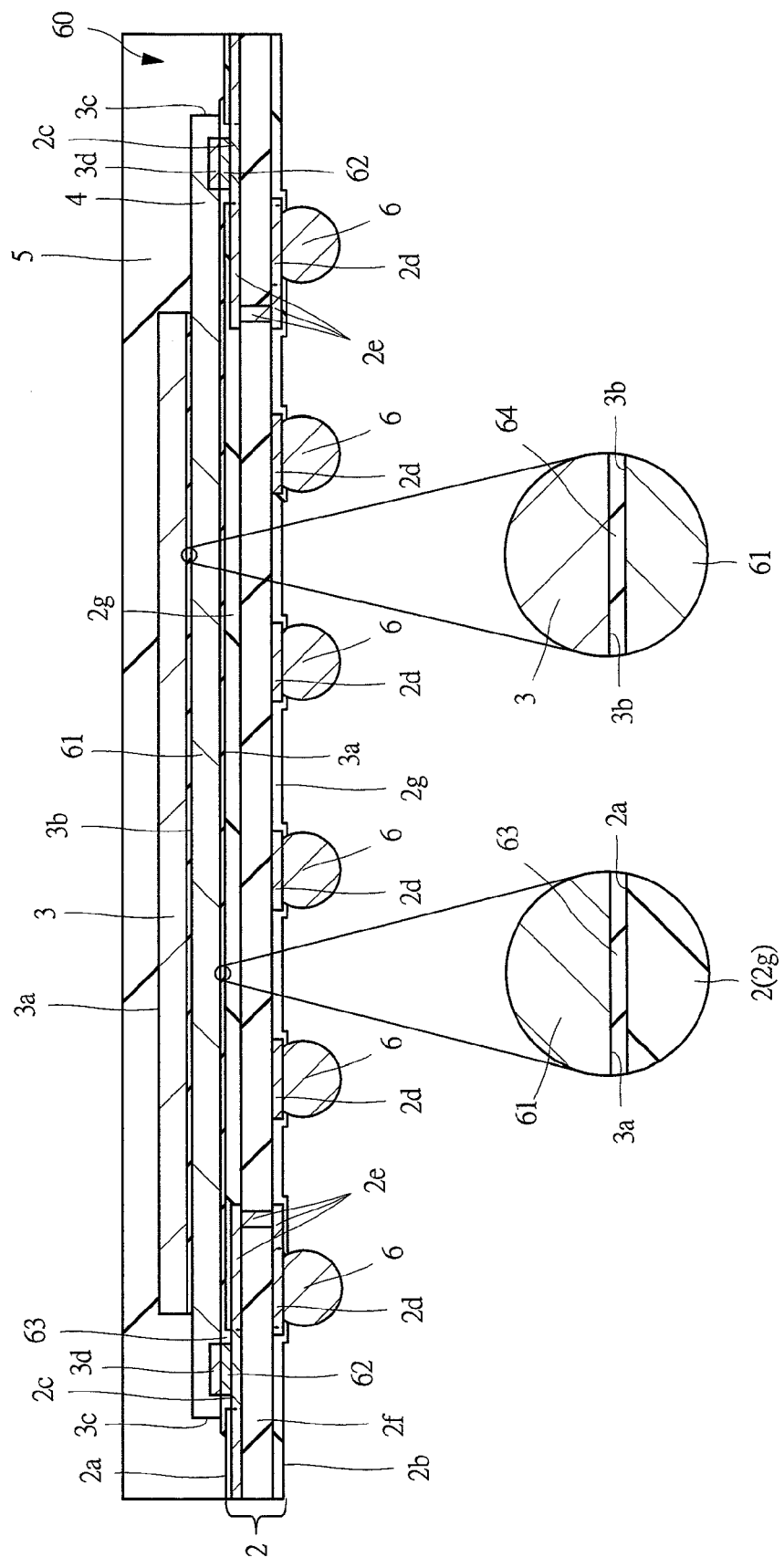
FIG. 29 is a cross-sectional view illustrating a modification example with respect to FIG. 4.

Next, a modification example in terms of the structure of the semiconductor chip will be described. FIG. 29 is a cross-sectional view illustrating a modification example with respect to FIG. 4.

A semiconductor device 60 illustrated in FIG. 29 and the semiconductor device 1 illustrated in FIG. 4 are different in the point that the semiconductor device 60 is mounted in what we call the face-down packaging method, in which the front surface 3a of a semiconductor chip 61 is mounted so as to be opposed to the upper surface 2a of the wiring board (substrate) 2. The semiconductor chip 61 illustrated in FIG. 29 is similar to the semiconductor chip 3 illustrated in FIG. 4 except the point that a plurality of bump electrodes 62 are formed on the front surface 3a side. In the case in which the face-down packaging method is used in this manner, the plurality of bump electrodes (front-surface-side projecting electrodes) 62 projecting from the front surface 3a are formed on the front surface 3a (specifically, on the pads 3d) of the semiconductor chip 61. The plurality of pads 3d of the semiconductor chip 61 are electrically connected to the plurality of bonding leads 2c of the wiring board 2 via the plurality of bump electrodes 62. An underfill resin (sealant) 63 is disposed between the semiconductor chip 61 and the wiring board 2 so as to seal a joining part (including the bump electrodes 62) of the pads 3d and the bonding leads 2c. In this manner, in the face-down packaging method, a state that the front surface 3a side of the semiconductor chip 61 is sealed and that the rear surface thereof is exposed from the underfill resin 63 can be achieved; therefore, the thickness of the semiconductor device can be reduced than the case in which the face-up packaging method illustrated in FIG. 4 is used.

Note that, in FIG. 29, the semiconductor chip 3 mounted on the semiconductor chip 61 is electrically connected to the wiring board 2, for example, via wires, which are not illustrated; therefore, the rear surface 3b of the semiconductor chip 61 is also sealed in the sealant 5; however, in an aspect, in which the semiconductor chips 3 are not stacked, as a modification example with respect to FIG. 29, the rear surface 3b of the semiconductor chip 61 can be exposed (a state that the semiconductor chip 3 and the sealant 5 illustrated in FIG. 29 are removed can be achieved). Even when the thickness of the semiconductor chip 61 is reduced to a thickness of, for example, about 50 μm or less by manufacturing the chip in a manner similar to the above-described semiconductor chip 3, reduction in the strength of the semiconductor chip 61 can be suppressed; therefore, combination with the face-down packaging method is suitable in the point that the thickness can be further reduced.

The semiconductor device 60 illustrated in FIG. 29 and the semiconductor device 1 illustrated in FIG. 4 are different from each other in the point that the plurality of semiconductor chips 61 and 3 are mounted in a stack on the wiring board (substrate) 2. In other words, the semiconductor chip 3 is further stacked on the semiconductor chip 61 (on the rear surface 3b of the semiconductor chip 61 in FIG. 29). Specifically, the semiconductor chip 3 is mounted on the rear surface 3b of the semiconductor chip 61 via a bonding material (for example, an adhesive tape in which sticking layers are disposed on both surfaces) 64. The functions of the semiconductor device 60 can be advanced by mounting the plurality of semiconductor chips 61 and 3 in one semiconductor package (semiconductor device 60). For example, if the semiconductor chip 3 is a memory chip in which a memory circuit is formed and if the semiconductor chip 61 is a controller chip in which a control circuit controlling the semiconductor chip 3 serving as the memory chip is formed, the semiconductor device 60 serves as a so-called SIP (System in Package) type semiconductor device constituting a system in one package. The thickness of the SIP-type semiconductor device can be reduced by mounting the plurality of semiconductor chips 61 and 3 by stacking. Furthermore, as described above, even when the thickness of each of the plurality of semiconductor chips 61 and 3 is reduced to a thickness of, for example, about 50 µm or less, reduction in the strength of the semiconductor chips 61 and 3 can be suppressed; therefore, combination with the SIP-type semiconductor device is suitable in the point that the thickness can be further reduced.

Figure 30:
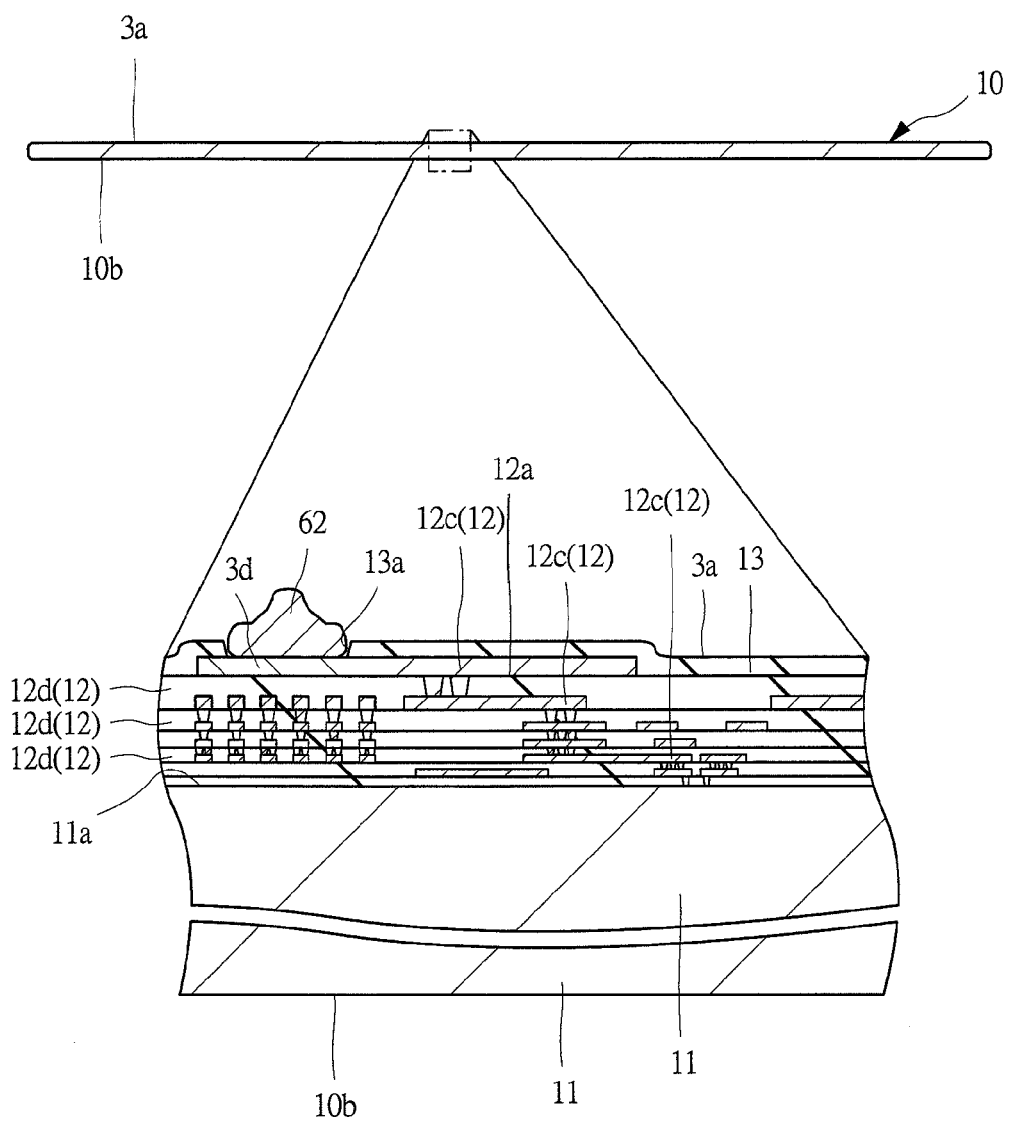
FIG. 30 is a cross-sectional view illustrating a modification example with respect to FIG. 7.
Figure 31:
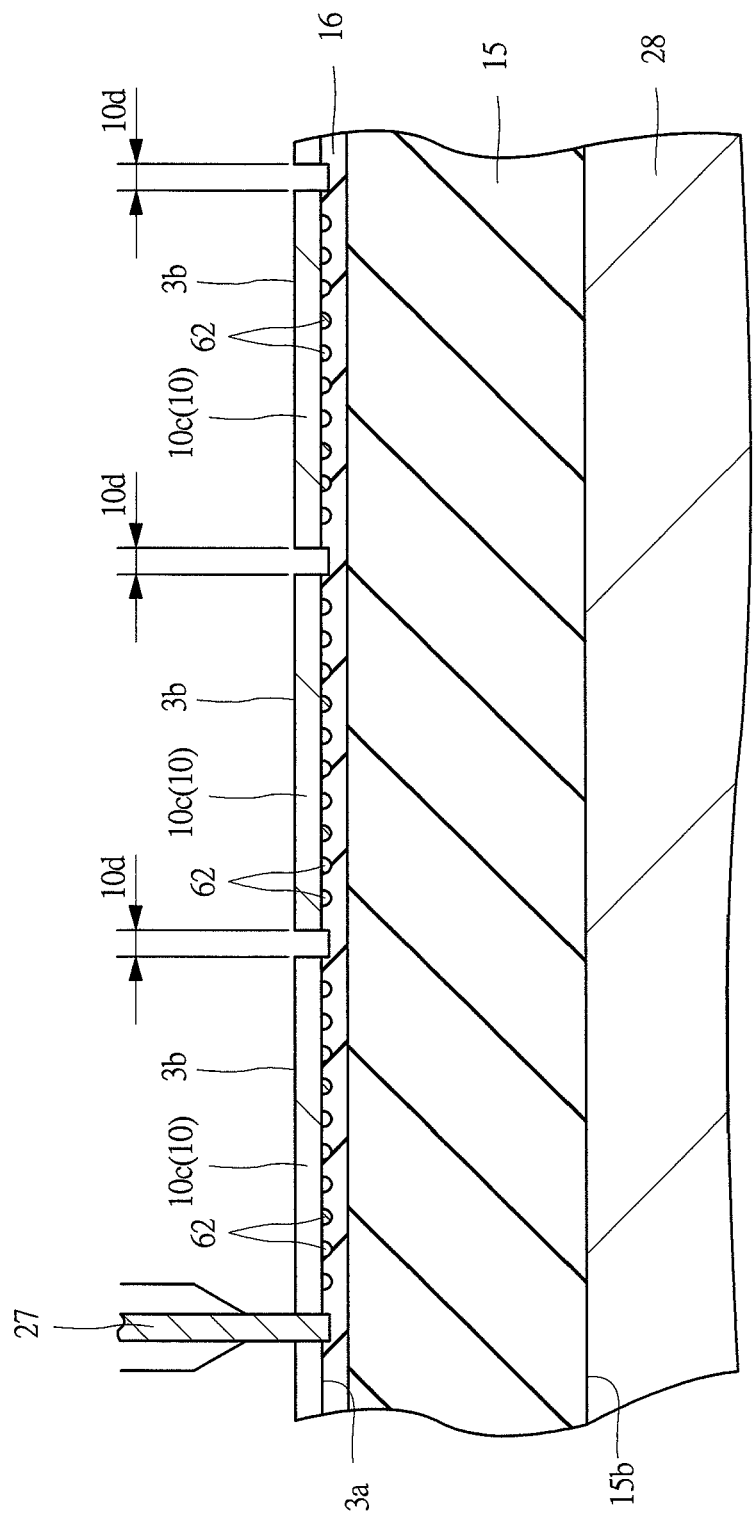
FIG. 31 is an enlarged cross-sectional view illustrating another modification example with respect to FIG. 14.

The semiconductor chip 61 illustrated in FIG. 29 can be manufactured by a flow substantially similar to that of the semiconductor chip 3, and different points will be described. FIG. 30 is a cross-sectional view illustrating a modification example with respect to FIG. 7, and FIG. 31 is an enlarged cross-sectional view illustrating another modification example with respect to FIG. 14.

In the step of preparing the semiconductor chip 61 illustrated in FIG. 29, first, in the wafer preparing step (see FIG. 5), the bump electrodes 62 are joined onto the pads 3d as illustrated in FIG. 30. The bump electrodes 62 are composed of, for example, gold and can be joined by applying wire bonding techniques. When the bump electrodes 62 are formed in this manner on the front surface 3a side of the wafer 10 in the wafer preparing step, the steps after the wafer fixing step are carried out in the state in which the bump electrodes 62 are formed on the front surface 3a. Particularly, as illustrated in FIG. 31, in the dividing step, if the bump electrodes 62 are not firmly fixed, the wafer 10 is moved during cutting processing, and the crushed layers 30b (see FIG. 16) are more easily formed. Alternatively, the thickness of the crushed layers 30b is increased. The point that the wafer 10 is easily moved during processing is similar also in the above-described rear-surface grinding step. In other words, in the case in which the bump electrodes 62 are formed in the wafer preparing step, the crushed layers 30b are easily formed, and reduction in the strength of the obtained semiconductor chip 61 can be suppressed by removing the crushed layers 30b in the crushed-layer removing step in the above-described manner. In the case in which the bump electrodes 62 are formed before the dividing step and the rear-surface grinding step, it is particularly preferable to fix the supporting member 15 via the bonding material 16 composed of a hardened resin as illustrated in FIG. 31. As a result, the gaps between the peripheral of the bump electrodes 62 and the bonding material 16 can be reduced more than that in the case in which the wafer 10 is fixed by the adhesive tape 50 as illustrated in FIG. 27; and, as a result, the thickness of the crushed layers 30b can be reduced.

Although illustration is omitted, the method of manufacturing the semiconductor device 60 illustrated in FIG. 29 includes a step of stacking the semiconductor chip 3 on the semiconductor chip 61 in the die bonding step illustrated in FIG. 5. Specifically, the method includes a step of mounting the semiconductor chip 61 on the wiring board 2 (may be the wiring board 40 illustrated in FIG. 19) and then a step of mounting the semiconductor chip 3 on the semiconductor chip 61.

Figure 32:
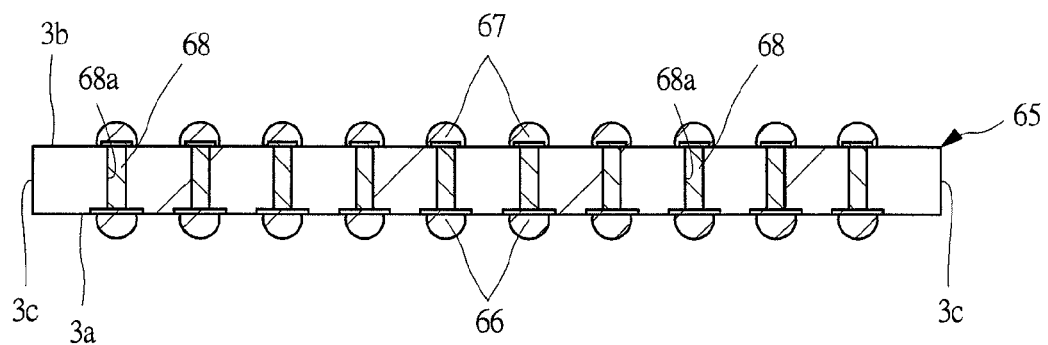
FIG. 32 is a cross-sectional view schematically illustrating a semiconductor chip of a through-electrode structure.
Figure 33:
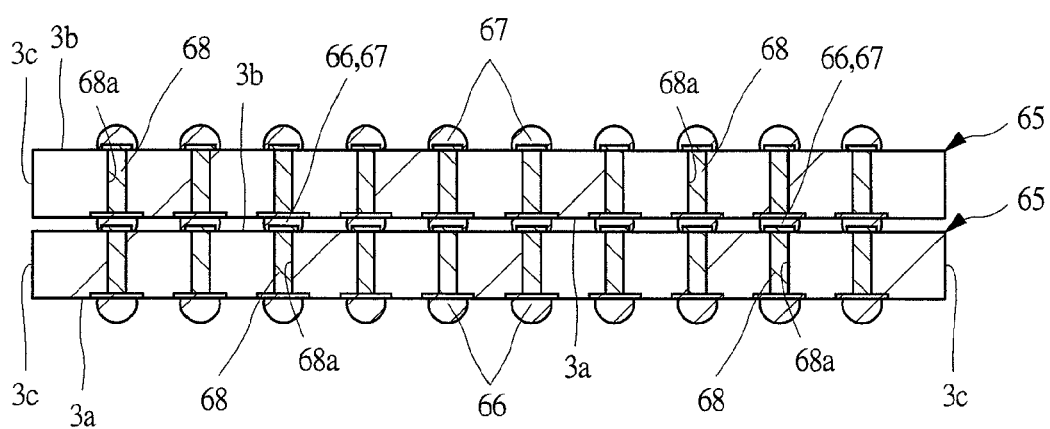
FIG. 33 is a cross-sectional view schematically illustrating a state in which two semiconductor chips illustrated in FIG. 32 are stacked.

Next, an example applied to a semiconductor chip of a through-electrode structure will be described as a modification example of a thin-type semiconductor chip. The through-electrode structure refers to the structure in which bump electrodes are formed on the surface and rear surface of the semiconductor chip and the bump electrodes in the front surface side and the bump electrodes in the rear surface side are electrically connected via electrically-conductive members embedded so as to penetrate the semiconductor chip in a thickness direction. FIG. 32 is a cross-sectional view schematically illustrating the semiconductor chip of the through-electrode structure, and FIG. 33 is a cross-sectional view schematically illustrating a state in which two semiconductor chips each illustrated in FIG. 32 are stacked.

In a semiconductor chip 65 illustrated in FIG. 32, a plurality of bump electrodes (front-surface-side projecting electrodes) 66 are formed on the front surface 3a, and a plurality of bump electrodes (rear-surface-side projecting electrodes) 67 are formed on the rear surface 3b. Each of the bump electrodes 66 and 67 is electrically connected via wiring (electrically-conductive member, front/back conduction wiring) 68 embedded in a through hole 68a penetrating through the semiconductor chip 3 in the thickness direction. The bump electrodes 66 and 67 are composed of, for example, solder, and the wiring 68 is composed of, for example, copper. The semiconductor chip 65 having such a through-electrode structure can be electrically connected to a plurality of semiconductor chips 65 by connecting the bump electrodes 66 and 67 in the manner illustrated in FIG. 33. In other words, the semiconductor chip 65 having the through-electrode structure can be electrically connected to the plurality of semiconductor chips 65 without the intermediation of the wiring board 2 as illustrated in FIG. 29. Therefore, in the case in which the stacked structures of the plurality of semiconductor chips 65 illustrated in FIG. 33 are mounted on, for example, the wiring board 2 illustrated in FIG. 29, the layout of the wiring pattern on the wiring board 2 can be simplified; therefore, it is advantageous in the viewpoint of downsizing and thickness reduction of the wiring board. FIG. 33 illustrates an example in which the two semiconductor chips 65 having the same planar dimensions of the front surface 3a are stacked. However, for example, when a wiring pattern is formed on the rear surface 3b side, semiconductor chips having mutually different planar dimensions of the front surface 3a can be stacked and electrically connected to each other.

Figure 34:
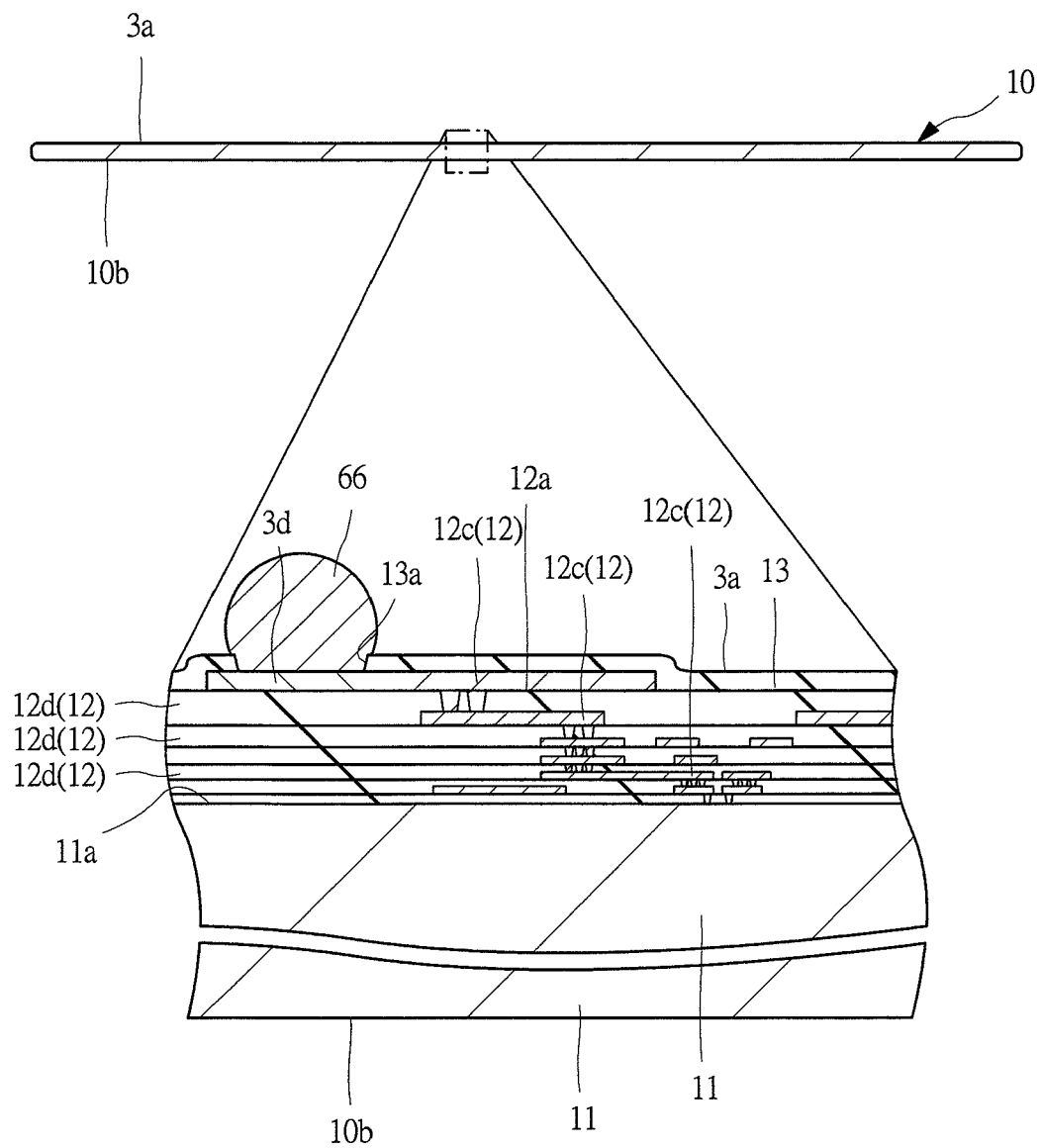
FIG. 34 is a cross-sectional view illustrating another modification example with respect to FIG. 7.

The semiconductor chip 65 of the through-electrode structure illustrated in FIG. 32 can be manufactured by a flow substantially similar to that of the semiconductor chip 3, and different points will be simply described. FIG. 34 is a cross-sectional view illustrating another modification example with respect to FIG. 7, FIG. 35 is an enlarged cross-sectional view illustrating a through-hole forming step of forming through holes in the chip region of the semiconductor wafer after the rear-surface grinding step illustrated in FIG. 5, and FIG. 36 is an enlarged cross-sectional view illustrating a step of electrically-conductive-member embedding step of embedding electrically-conductive members in the through holes after the through-hole forming step illustrated in FIG. 35. FIG. 37 is an enlarged cross-sectional view illustrating a rear-surface-side projecting electrode forming step of forming bump electrodes in the rear surface side of the chip region after the electrically-conductive-member embedding step illustrated in FIG. 36. FIGS. 35 to 37 are illustrating in an enlarged manner one of the plurality of chip regions 10c provided on the wafer 10.

The semiconductor chip preparing step (see FIG. 5) of obtaining the semiconductor chip 65 of the through-electrode structure includes the following steps. First, in the wafer preparing step (see FIG. 5), as illustrated in FIG. 34, bump electrodes (front-surface-side projecting electrodes) 66 formed of, for example, solder are formed. The bump electrodes 66 can be joined with the pads 3d, for example, by disposing solder balls on the pads 3d and melting the solder balls. Then, after the thickness of the wafer 10 is reduced to, for example, 50 μm or less in the rear-surface grinding step (see FIG. 5), a plurality of through holes 68a are formed in each of the plurality of chip regions 10c as illustrated in FIG. 35. The plurality of through holes 68a are formed, for example, by etching from the rear surface 3b side of the chip region toward the front surface 3a side to penetrate therethrough until the holes reach the pads 3d joined with the bump electrodes 66 (until the rear surfaces of the pads 3d are exposed). Then, as illustrated in FIG. 36, wirings 68 composed of, for example, copper are embedded in the plurality of through holes 68a, respectively, so as to electrically connect the plurality of bump electrodes 66 and the plurality of wirings 68. In order to prevent the plurality of wirings 68 from short-circuiting on the rear surface 3b, it is preferred to polish the rear surface 3b, for example, by the CMP (Chemical Mechanical Polishing) method after the electrically-conductive members are embedded to remove the electrically-conductive members on the rear surface 3b. Although illustration is omitted, a wiring pattern can be also formed on the rear surface 3b thereafter. Then, as illustrated in FIG. 37, the plurality of bump electrodes (rear-surface-side projecting electrodes) 67 are formed on the rear surface 3b of the plurality of chip regions 10c so as to electrically connect them with the wirings 68 embedded in the plurality of through holes 68a.

As described above, in the steps of manufacturing the semiconductor chip 65 of the through-electrode structure, it is preferred to form the through holes 68a after the thickness of the chip region 10c is formed to be thin (for example, 50 μm) or less in order to easily form the through holes 68a. Also from the viewpoint of reducing the thickness of the semiconductor device in which the plurality of semiconductor chips 65 are stacked, it is preferable to carry out grinding until the thickness of the wafer 10 becomes 50 μm or less in the rear-surface grinding step. Therefore, applying the techniques described in the above-described embodiment is suitable.

In the foregoing, the invention made by the inventors of the present invention has been concretely described based on the embodiments. However, it is needless to say that the present invention is not limited to the foregoing embodiments and various modifications and alterations can be made within the scope of the present invention. Hereinafter, modification examples other than the aspects described in the above-described embodiments will be described.

For example, the modification examples have been described as modification examples with respect to FIGS. 1 to 23 in order to facilitate understanding of the points different from the aspect described in the above-described embodiment; however, these modification examples can be applied in combination.

The present invention can be widely applied to semiconductor devices.

What is claimed is:

1. A method of manufacturing a semiconductor device, comprising the steps of:
    (a1) attaching a front surface of a semiconductor wafer to a supporting member via a bonding material comprised of an ultraviolet curable resin, the semiconductor wafer having a semiconductor substrate, the front surface, a plurality of chip regions formed on the front surface, a dicing region formed between adjacent chip regions, and a rear surface opposite to the front surface, the supporting member being a glass plate having a higher transmittance of ultraviolet rays than the semiconductor substrate;
    (a2) radiating the ultraviolet curable resin through the supporting member, using ultraviolet rays, to cure the ultraviolet curable resin;
    (b) grinding the rear surface of the semiconductor wafer while the semiconductor wafer is fixed to the supporting member;
    (c) dividing the semiconductor wafer into the chip regions using a blade by cutting along the dicing region of the semiconductor wafer while the semiconductor wafer is fixed to the supporting member;
    (d) after the step (c), etching a side surface of each of the chip regions, using plasma etching gas or wet etching liquid, so as to remove a crushed layer formed in the step (c) on the side surface of each of the chip regions; and
    (e) after the step (d), attaching a tape to a rear surface of each of the chip regions via an adhesive material formed on the tape, and peeling off the chip regions from the supporting member so as to obtain a plurality of semiconductor chips.

2. The method of manufacturing a semiconductor device according to claim 1, wherein
    the step (c) is carried out after the step (b).

3. The method of manufacturing a semiconductor device according to claim 2, wherein
    the supporting member has a thickness larger than a thickness of the semiconductor wafer obtained after being ground in the step (b).

4. The method of manufacturing a semiconductor device according to claim 3, wherein
    the supporting member has a rigidity higher than the semiconductor wafer after being ground in the step (b).

5. The method of manufacturing a semiconductor device according to claim 4, wherein
    the supporting member has a bonding surface opposed to the front surface of the semiconductor wafer; and
    the step (a1) includes the steps of:
        applying the bonding material, comprised of liquid, to one of or both of the front surface of the semiconductor wafer and the bonding surface of the supporting member; and
        mutually bonding the semiconductor wafer and the supporting member via the bonding material.

6. The method of manufacturing a semiconductor device according to claim 1, wherein,
    in the step (c), the semiconductor wafer is divided into the chip regions by running the blade once along the dicing region.

7. The method of manufacturing a semiconductor device according to claim 1, wherein,
    in the step (c), a metal pattern is disposed in the dicing region of the semiconductor wafer in which the blade is run.

8. The method of manufacturing a semiconductor device according to claim 1, wherein
a plurality of front-surface-side projecting electrodes projecting from the front surface are formed in each of the plurality of chip regions of the semiconductor wafer prepared in the step (a1).

9. The method of manufacturing the semiconductor device according to claim 8, further comprising the steps of:
(f) after the step (b) and before the step (c), forming a plurality of through holes from the rear surface side toward the front surface side of the chip regions;
(g) after the step (f) and before the step (c), embedding electrically-conductive members in the through holes, respectively, so as to electrically connect the front-surface-side projecting electrodes and the electrically-conductive members to each other; and
(h) after the step (g) and before the step (c), forming a plurality of rear-surface-side projecting electrodes on each of the rear surfaces of the chip regions so as to electrically connect with the electrically-conductive members.

10. The method of manufacturing the semiconductor device according to claim 1, further comprising the steps of:
(f) mounting a first semiconductor chip of the semiconductor chips on a substrate after the step (e); and
(g) mounting a second semiconductor chip on the first semiconductor chip after the step (f).

11. A method of manufacturing a semiconductor device, comprising the steps of:
(a1) attaching a front surface of a semiconductor wafer to a supporting member via a bonding material comprised of an ultraviolet curable resin, the semiconductor wafer having a semiconductor substrate, the front surface, a plurality of chip regions formed on the front surface, a dicing region formed between adjacent chip regions, and a rear surface opposite to the front surface, the supporting member being a glass plate having a higher transmittance of ultraviolet rays than the semiconductor substrate;
(a2) radiating the ultraviolet curable resin through the supporting member, using ultraviolet rays, to cure the ultraviolet curable resin;
(b) grinding the rear surface of the semiconductor wafer while the semiconductor wafer is fixed to the supporting member;
(c) dividing the semiconductor wafer into the chip regions using a laser by irradiating along the dicing region of the semiconductor wafer while the semiconductor wafer is fixed to the supporting member;
(d) after the step (c), etching a side surface of each of the chip regions, using plasma etching gas or wet etching liquid, so as to remove a crushed layer formed in the step (c) on the side surface of each of the chip regions; and
(e) after the step (d), attaching a tape to a rear surface of each of the chip regions via an adhesive material formed on the tape, and peeling off the chip regions from the supporting member so as to obtain a plurality of semiconductor chips.

12. The method of manufacturing the semiconductor device according to claim 11, wherein
the step (c) is carried out after the step (b).

13. The method of manufacturing the semiconductor device according to claim 12, wherein
the supporting member has a thickness larger than a thickness of the semiconductor wafer after being ground in the step (b).

14. The method of manufacturing the semiconductor device according to claim 13, wherein
the supporting member has a rigidity higher than the semiconductor wafer after being ground in the step (b).

15. The method of manufacturing the semiconductor device according to claim 14, wherein
the supporting member has a bonding surface opposed to the front surface of the semiconductor wafer; and
the step (a1) includes the steps of:
applying the bonding material, comprised of liquid, to one of or both of the front surface of the semiconductor wafer and the bonding surface of the supporting member; and
mutually bonding the semiconductor wafer and the supporting member via the bonding material.

16. The method of manufacturing the semiconductor device according to claim 11, wherein
a plurality of front-surface-side projecting electrodes projecting from the front surface are formed in each of the plurality of chip regions of the semiconductor wafer prepared in the step (a1).

17. The method of manufacturing the semiconductor device according to claim 16, further comprising the steps of:
(f) after the step (b) and before the step (c), forming a plurality of through holes from the rear surface side toward the front surface side of the chip regions;
(g) after the step (f) and before the step (c), embedding electrically-conductive members in the through holes, respectively, to electrically connect the front-surface-side projecting electrodes and the electrically-conductive members to each other; and
(h) after the step (g) and before the step (c), forming a plurality of rear-surface-side projecting electrodes on the rear surfaces of the chip regions to electrically connect with the electrically-conductive members.

18. The method of manufacturing the semiconductor device according to claim 11, further including below steps of:
(f) after the step (e), a step of mounting a first semiconductor chip of the semiconductor chips on a substrate; and
(g) after the step (f), a step of mounting a second semiconductor chip different from the first semiconductor chip on the first semiconductor chip.

* * * * *